(12) United States Patent
Suzuki et al.

(10) Patent No.: US 10,247,759 B2
(45) Date of Patent: Apr. 2, 2019

(54) CURRENT SENSOR

(71) Applicant: Asahi Kasei Microdevices Corporation, Tokyo (JP)

(72) Inventors: Kenji Suzuki, Tokyo (JP); Hideto Imajo, Tokyo (JP); Hidenori Hasegawa, Tokyo (JP); Kenji Kai, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 484 days.

(21) Appl. No.: 14/916,259

(22) PCT Filed: Aug. 29, 2014

(86) PCT No.: PCT/JP2014/004456
§ 371 (c)(1),
(2) Date: Mar. 3, 2016

(87) PCT Pub. No.: WO2015/033541
PCT Pub. Date: Mar. 12, 2015

(65) Prior Publication Data
US 2016/0223594 A1    Aug. 4, 2016

(30) Foreign Application Priority Data

Sep. 5, 2013 (JP) .................................. 2013-184301
May 27, 2014 (JP) .................................. 2014-109349

(51) Int. Cl.
*H01L 21/00* (2006.01)
*G01R 15/20* (2006.01)
*G01R 1/00* (2006.01)

(52) U.S. Cl.
CPC ................ *G01R 15/20* (2013.01); *G01R 1/00* (2013.01); *H01L 21/00* (2013.01); *H01L 2221/00* (2013.01)

(58) Field of Classification Search
CPC ........ H01L 21/00; H01L 2221/00; G01R 1/00
See application file for complete search history.

(56) References Cited

U.S. PATENT DOCUMENTS 4,887,027 A * 12/1989 Strasser .................... G01R 1/07
324/117 H
6,424,018 B1    7/2002 Ohtsuka
(Continued)

FOREIGN PATENT DOCUMENTS

JP    2000-174357 A    6/2000
JP    2003-510612 A    3/2003
(Continued)

OTHER PUBLICATIONS

International Search Report issued in corresponding International Patent Application No. PCT/JP2014/004456 dated Dec. 9, 2014.
(Continued)

*Primary Examiner* — Jermele M Hollington
*Assistant Examiner* — Temilade Rhodes-Vivour
(74) *Attorney, Agent, or Firm* — Morgan, Lewis & Bockius LLP

(57) ABSTRACT

A current sensor includes a first current pathway, a first magnetic sensor arranged near the first current pathway, a second magnetic sensor arranged opposite the first magnetic sensor with the first current pathway in between, a second current pathway, a third magnetic sensor arranged near the second current pathway, a fourth magnetic sensor arranged opposite the third magnetic sensor with the second current pathway in between, and a signal processor that generates a signal based on a quantity of the first measured current from output of the first magnetic sensor and output of the second magnetic sensor, and also generates a signal based on a
(Continued)

quantity of the second measured current from output of the third magnetic sensor and output of the fourth magnetic sensor.

30 Claims, 22 Drawing Sheets

(56) References Cited

U.S. PATENT DOCUMENTS

| | | | | |
|---|---|---|---|---|
| 6,605,936 B1* | 8/2003 | Tamai | ................ | G01R 15/202 |
| | | | | 324/117 R |
| 2005/0053814 A1* | 3/2005 | Imamura | ............ | B60L 11/1881 |
| | | | | 429/413 |
| 2008/0054881 A1* | 3/2008 | Kim | .................... | G01R 19/165 |
| | | | | 324/117 R |
| 2011/0050222 A1 | 3/2011 | Ueno et al. | | |
| 2013/0162245 A1* | 6/2013 | Tamura | ................ | G01R 33/07 |
| | | | | 324/225 |
| 2013/0265041 A1* | 10/2013 | Friedrich | ............ | G01R 15/207 |
| | | | | 324/260 |
| 2014/0097826 A1 | 4/2014 | Hebiguchi et al. | | |

FOREIGN PATENT DOCUMENTS

| | | |
|---|---|---|
| JP | 2010-266290 A | 11/2010 |
| JP | 2011-53061 A | 3/2011 |
| WO | 01/023899 A1 | 4/2001 |
| WO | 2006/130393 A1 | 12/2006 |
| WO | 2013/005459 A1 | 1/2013 |

OTHER PUBLICATIONS

Translation of International Preliminary Report on Patentability and Written Opinion issued in corresponding International Patent Application No. PCT/JP2014/004456 dated Mar. 17, 2016.

* cited by examiner

CURRENT SENSOR

TECHNICAL FIELD

The present invention relates to a current sensor including a magnetic sensor.

BACKGROUND ART

It is known that a current sensor includes a magnetic sensor, for example, and outputs a signal whose magnitude is proportional to a magnetic field produced by current flowing through a conductor. For example, Patent Literature 1 discloses a current sensor having a substrate, multiple magnetic field transducers, i.e., magnetic sensors, provided on the substrate and a current conductor, in which the multiple magnetic sensors detect current flowing through the current conductor in one channel.

CITATION LIST

Patent Literature

Patent Literature 1: International Publication Pamphlet No. 2006/130393

SUMMARY OF INVENTION

Technical Problem

In a conventional current sensor, when there are multiple pathways (channels) through which the current to be measured flows, it is necessary to introduce countermeasures so that the magnetic flux produced by the respective flows of current to be measured do not affect each other's magnetic sensor. For example, magnetic shielding may be introduced, or the magnetic sensors may be arranged at a fixed interval.

In particular, when using current sensors for the inverter control of a three-phase motor, which is one of the major applications of current sensors, generally it is necessary to detect the current in two of the phases, and thus two current sensors are used. However, as inverters are miniaturized further, the demand to decrease the space reserved for current detection is becoming a major challenge.

As a possible solution, investigation has begun into coreless current sensors, which enable more compact current sensors to be realized. However, since coreless current sensors do not have a magnetic core, applying magnetic shielding is difficult, and the degree to which the effects of external magnetic fields may be reduced is an issue. Additionally, dual-channel sensors are effective for realizing further miniaturization, but since the magnetic flux produced by the flow of current to be measured affects the magnetic sensor of the other channel, realization has been difficult thus far.

In view of the aforementioned situation, it is an object of the present invention to reduce the mutual interference of magnetic flux produced by respective flows of current to be measured in multiple current pathways whereby it is possible to perform accurate current detection.

Solution to Problem

A current sensor for solving the above problems includes a first current pathway through which a first measured current flows, a first magnetic sensor arranged near the first current pathway, a second magnetic sensor arranged opposite the first magnetic sensor with the first current pathway in between, a second current pathway through which a second measured current flows, a third magnetic sensor arranged near the second current pathway, a fourth magnetic sensor arranged opposite the third magnetic sensor with the second current pathway in between, and a signal processor that generates a signal based on a quantity of the first measured current from output of the first magnetic sensor and output of the second magnetic sensor, and also generates a signal based on a quantity of the second measured current from output of the third magnetic sensor and output of the fourth magnetic sensor. The first magnetic sensor and the second magnetic sensor are arranged at an equal distance from the second current pathway, and the third magnetic sensor and the fourth magnetic sensor are arranged at an equal distance from the first current pathway.

The first current pathway may include a first pathway, a second pathway curving from the first pathway, and a third pathway additionally curving from the second pathway, the second current pathway includes a fourth pathway, a fifth pathway curving from the fourth pathway, and a sixth pathway additionally curving from the fifth pathway, the second pathway is a pathway parallel to a line segment joining the third magnetic sensor and the fourth magnetic sensor, and the fifth pathway is a pathway parallel to a line segment joining the first magnetic sensor and the second magnetic sensor.

The first magnetic sensor may be arranged in an area enclosed by the first current pathway, the second magnetic sensor is arranged opposite the first magnetic sensor with the first pathway in between, the third magnetic sensor is arranged in an area enclosed by the second current pathway, and the fourth magnetic sensor is arranged opposite the third magnetic sensor with the fourth pathway in between.

The second pathway may be a line-symmetric pathway taking, as an axis of symmetry, a perpendicular bisector of a line segment joining the third magnetic sensor and the fourth magnetic sensor, and the fifth pathway is a line-symmetric pathway taking, as an axis of symmetry, a perpendicular bisector of a line segment joining the first magnetic sensor and the second magnetic sensor.

The first pathway may be a pathway connected to one end of the second pathway, and starting from the one end of the second pathway, extending in a direction away from or in a direction approaching the third magnetic sensor and the fourth magnetic sensor, the third pathway is a pathway connected to an other end of the second pathway, and starting from the other end of the second pathway, extending in a direction away from or in a direction approaching the third magnetic sensor and the fourth magnetic sensor, the fourth pathway is a pathway connected to one end of the fifth pathway, and starting from the one end of the fifth pathway, extending in a direction away from or in a direction approaching the first magnetic sensor and the second magnetic sensor, and the sixth pathway is a pathway connected to an other end of the fifth pathway, and starting from the end of the fifth pathway, extending in a direction away from or in a direction approaching the first magnetic sensor and the second magnetic sensor.

An angle obtained between the first pathway and the second pathway, an angle obtained between the second pathway and the third pathway, an angle obtained between the fourth pathway and the fifth pathway, and an angle obtained between the fifth pathway and the sixth pathway may be 90 degrees.

The signal processor may generate a signal based on a quantity of the first measured current from a difference between output of the first magnetic sensor and output of the second magnetic sensor, and generate a signal based on a quantity of the second measured current from a difference between output of the third magnetic sensor and output of the fourth magnetic sensor.

The first current pathway and the second current pathway may be U-shaped.

The first current pathway and the second current pathway may exist in an approximately point-symmetric positional relationship about a prescribed point between the second pathway and the fifth pathway.

Provided that the first pathway, the first magnetic sensor, and the second magnetic sensor are designated as a first pattern, and the fourth pathway, the third magnetic sensor and the fourth magnetic sensor are designated as a second pattern, the first pattern and the second pattern may exist in an approximately point-symmetric positional relationship about a prescribed point between the second pathway and the fifth pathway facing opposite the second pathway.

A perpendicular bisector of a line segment joining the first magnetic sensor and the second magnetic sensor may pass through a center of the third magnetic sensor, and a perpendicular bisector of a line segment joining the third magnetic sensor and the fourth magnetic sensor may pass through a center of the first magnetic sensor.

The current sensor may include a lead frame forming signal terminals, an encapsulation member that encapsulates the first to second current pathways and the first to fourth magnetic sensors, a first current terminal connected to the first current pathway and configured to act as an inlet of the first measured current, a second current terminal connected to the first current pathway and configured to act as an outlet of the first measured current, a third current terminal connected to the second current pathway and configured to act as an inlet of the second measured current, and a fourth current terminal connected to the second current pathway and configured to act as an outlet of the second measured current. The encapsulation member may have a rectangular shape in a planar view, and the lead frame forming the first to fourth current terminals and the signal terminals may be exposed from a side face of the encapsulation member in a planar view.

The first current terminal and the second current terminal may be exposed from a side face, among the side faces of the encapsulation member, that is positioned at a right angle to the side face from which the lead frame forming the signal terminals is exposed, and the third current terminal and the fourth current terminal may be exposed from a side face, among the side faces of the encapsulation member, that opposes the side face from which the first current terminal and the second current terminal are exposed.

The first to fourth current terminals may be exposed from a side face, among the side faces of the encapsulation member, that opposes the side face from which the lead frame forming the signal terminals is exposed.

The current sensor may include a conductor, arranged so as to enclose the second magnetic sensor, that is connected to either one of the first pathway and the second pathway, but not connected to the other, and a conductor, arranged so as to enclose the fourth magnetic sensor, that is connected to either one of the fourth pathway and the fifth pathway, but not connected to the other.

The current sensor further includes a third current pathway, a fifth magnetic sensor arranged near the third current pathway, and a sixth magnetic sensor arranged opposite the fifth magnetic sensor with the third current pathway in between. The first current pathway, the second current pathway and the third current pathway may be current pathways formed inside conductors that allow current of respectively different phases to flow. The third current pathway may include a seventh pathway, an eighth pathway curving from the seventh pathway and a ninth pathway additionally curving from the eighth pathway. The fifth magnetic sensor may be arranged in an area enclosed by the third current pathway. The sixth magnetic sensor may be arranged opposite the fifth magnetic sensor with the seventh pathway in between. A line segment joining the first magnetic sensor and the second magnetic sensor, a line segment joining the third magnetic sensor and the fourth magnetic sensor, and a line segment joining the fifth magnetic sensor and the sixth magnetic sensor may be parallel to each other.

Each of the first to third current pathways may be formed such that a current direction changes according to a cutout formed in the current pathway.

Each cutout in the adjacent current pathway may be formed at a distance of at least double an interval between a pair of magnetic sensors away along a direction in which the conductor of each phase extends.

Respective pairs of magnetic sensors for two phases may be arranged shifted away from each other at a distance of ½ an interval between a pair of magnetic sensors along a direction in which the conductor of each phase extends, and the pair of magnetic sensors for the remaining phase may be arranged at a distance of at least double the interval between a pair of magnetic sensors away along the direction in which the conductor extends.

Each current pathway may be formed inside a busbar acting as the conductor of each phase, the busbar of each phase and a printed circuit board may be formed integrally as a busbar board.

In the busbar board, both front and rear faces of the busbars may be covered by the printed circuit board.

In the busbar board, slits may be provided in the busbars.

In the busbar board, penetrating slits that penetrate the busbars and a board prepreg are provided, with inner walls of the penetrating slits being formed by the board prepreg so that the busbars are not exposed.

In the penetrating slits of the busbar board, a magneto-sensitive part of each of the magnetic sensors may be sunken farther inward than a mounting face of the busbar board, and arranged near a center of thickness of the busbars.

The busbar board may be provided with a magnetic material arranged on a face opposite the mounting face of respective magnetic sensors, so as to oppose and bridge the gap between the respective magnetic sensors.

In the busbar board, the magnetic material may extend towards the magnetic sensors neighborhood through grooves in the busbar board formed by hole drilling or cutout processing.

The busbar board may be provided with a magnetic material arranged on a top face of a package of the magnetic sensors, so as to bridge the gap between the respective magnetic sensors for each phase.

The busbars may include a U-phase busbar, a V-phase busbar adjacent to the U-phase busbar, and a W-phase busbar adjacent to the V-phase busbar. The first current pathway may be formed inside the U-phase busbar, the second current pathway may be formed inside the W-phase busbar, and the third current pathway is formed inside the V-phase busbar. The cutout formed in the third current pathway may be formed at a distance of at least twice an interval between a pair of magnetic sensors away from the cutout formed in the first current pathway and the cutout formed in the second current pathway, along a direction in which the busbars extend.

The current pathways may be formed in a metal layer inside the printed circuit board.

The signal processing IC and/or the magnetic sensors may be mounted on the printed circuit board.

The magnetic sensors may be internally provided with magnet plating or magnet chips.

Advantageous Effects of Invention

According to a current sensor of the present invention, it is possible to reduce the mutual interference of magnetic flux produced by respective flows of current to be measured in multiple current pathways whereby it is possible to perform accurate current detection.

DESCRIPTION OF EMBODIMENTS

Figure 1:
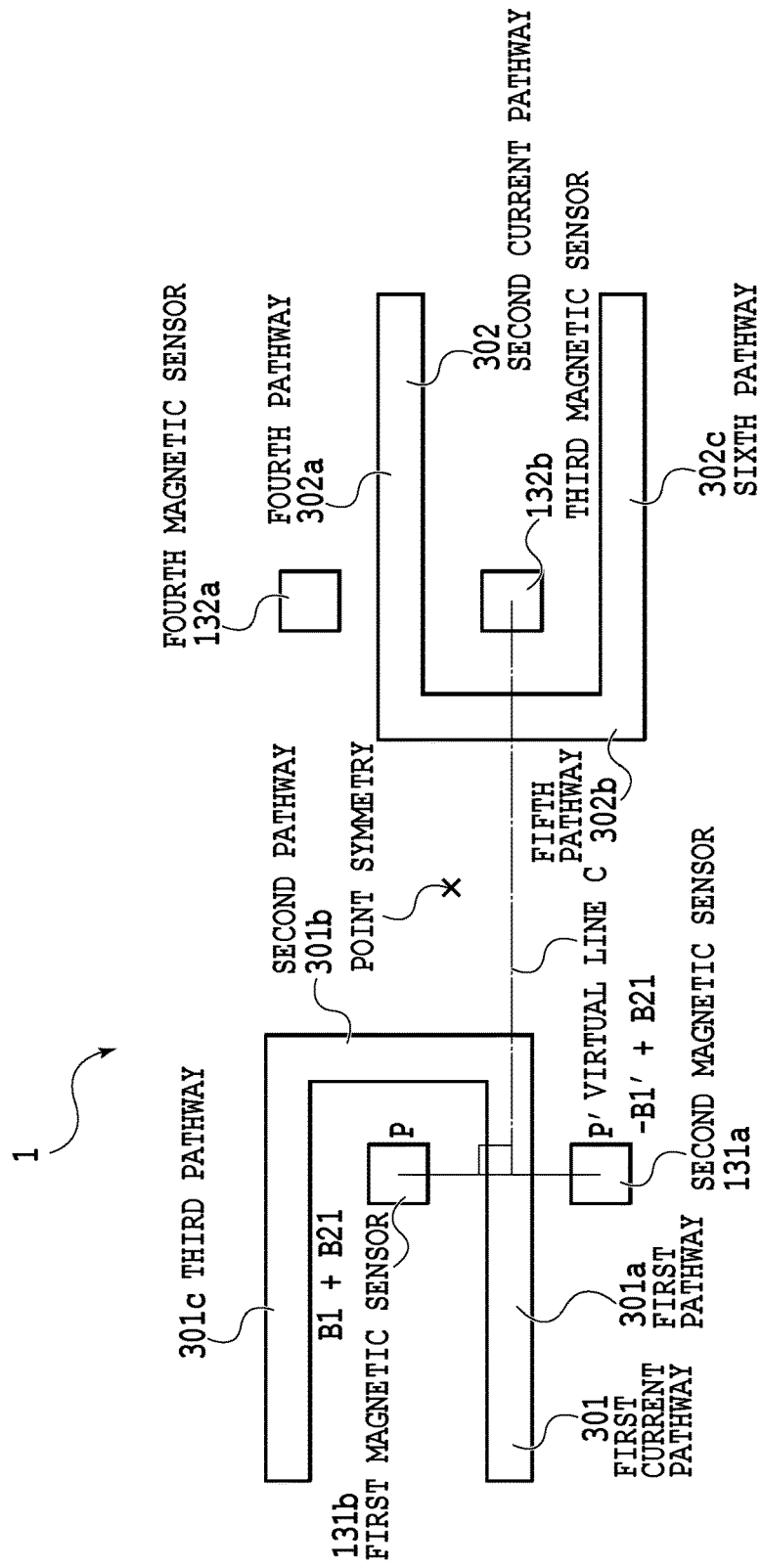
FIG. 1 is a block diagram illustrating an overview of a current sensor for realizing current detection according to the present embodiment.

Explanation will be hereinafter provided for embodiments of the present invention (hereinafter designated the present embodiments). It is noted that the present invention is not limited to the following present embodiments, and can also be modified in various ways while remaining within the scope of the present invention. It is noted that in the drawings, positional relationships, such as top, bottom, left and right, are based on the positional relationships illustrated in the drawings, unless specifically noted otherwise. Furthermore, the dimensional proportions of the drawings are not limited to the dimensions that are illustrated.

Figure 19:
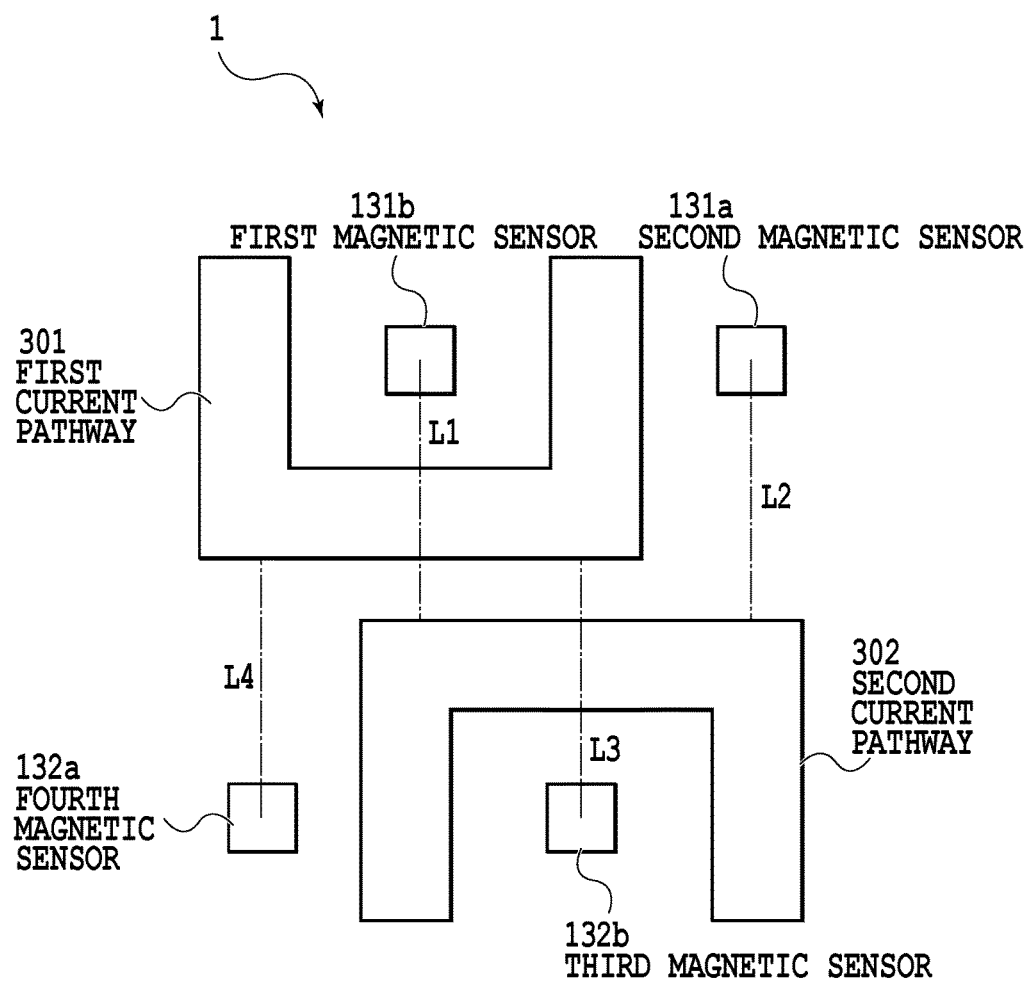
FIG. 19 is a diagram for explaining an overview of current detection realized by a current sensor according to the present embodiment.

An overview of current detection realized by a current sensor 1 according to the present embodiment will be described with reference to FIG. 19.

The current sensor 1 according to the present embodiment is equipped with multiple magnetic sensors 131a, 131b, 132a and 132b that detect magnetic flux, a first current pathway 301 through which a first measured current flows, and a second current pathway 302 through which a second measured current flows.

In the present embodiment, the magnetic sensors 131a, 131b, 132a and 132b may be any elements that detect magnetic flux or produce an electrical output (current or voltage) according to an input magnetic field, and may be elements such as Hall effect sensors, magnetoresistive sensors, Hall effect ICs or magnetoresistive ICs.

The first magnetic sensor 131b is placed near the first current pathway 301. The second magnetic sensor 131a is placed opposite the first magnetic sensor 131b with the first current pathway 301 in between. The third magnetic sensor 132b is placed near the second current pathway 302. The fourth magnetic sensor 132a is placed opposite the third magnetic sensor 132b with the second current pathway 302 in between.

The first magnetic sensor 131b and the second magnetic sensor 131a are placed at an equal distance from the second current pathway 302. In other words, provided that L1 is the shortest distance between the first magnetic sensor 131b and the second current pathway 302, and L2 is the shortest distance between the second magnetic sensor 131a and the second current pathway 302, the first magnetic sensor 131b and the second magnetic sensor 131a are placed at positions so that L1=L2.

The third magnetic sensor 132b and the fourth magnetic sensor 132a are placed at an equal distance from the first current pathway 301. In other words, provided that L3 is the shortest distance between the third magnetic sensor 132b and the first current pathway 301, and L4 is the shortest distance between the fourth magnetic sensor 132a and the first current pathway 301, the third magnetic sensor 132b and the fourth magnetic sensor 132a are placed at positions so that L3=L4.

The current sensor 1 is equipped with a signal processing IC (signal processor) discussed later that generates a signal based on the quantity of a first measured current from the output of the first magnetic sensor 131b and the output of the second magnetic sensor 131a, and also generates a signal based on the quantity of a second measured current from the output of the third magnetic sensor 132b and the output of the fourth magnetic sensor 132a. The signal processing IC generates a signal based on the quantity of the first measured current from the difference between the output of the first magnetic sensor 131b and the output of the second magnetic sensor 131a. In addition, the signal processing IC generates a signal based on the quantity of the second measured current from the difference between the output of the third magnetic sensor 132b and the output of the fourth magnetic sensor 132a.

The first magnetic sensor 131b and the second magnetic sensor 131a are placed at an equal distance from the second current pathway 302. For this reason, the magnetic field produced at the position of the first magnetic sensor 131b by the second measured current that flows through the second current pathway 302 is equal to the magnetic field produced at the position of the second magnetic sensor 131a. By calculating the difference between the output of the first magnetic sensor 131b and the output of the second magnetic sensor 131a, the effects of the second measured current are canceled out.

Similarly, the third magnetic sensor 132b and the fourth magnetic sensor 132a are placed at an equal distance from the first current pathway 301. For this reason, the magnetic field produced at the position of the third magnetic sensor 133b by the first measured current that flows through the first current pathway 301 is equal to the magnetic field produced at the position of the fourth magnetic sensor 132a. By calculating the difference between the output of the third magnetic sensor 132b and the output of the fourth magnetic sensor 132a, the effects of the second measured current are canceled out.

Next, an overview of the current sensor 1 for realizing the current detection will be described with reference to FIG. 1.

In the present embodiment, the first current pathway 301 includes a first pathway 301a, a second pathway 301b that curves from the first pathway 301a and a third pathway 301c that curves further from the second pathway 301b. The second current pathway 302 includes a fourth pathway 302a, a fifth pathway 302b that curves from the fourth pathway 302a and a sixth pathway 302c that curves further inward from the fifth pathway 302b.

The second pathway 301b is a pathway parallel to the line segment that joins the third magnetic sensor 132b and the fourth magnetic sensor 132a, while the fifth pathway 302b is a pathway parallel to the line segment that joins the first magnetic sensor 131b and the second magnetic sensor 131a. Consequently, the magnetic field produced at the position of the first magnetic sensor 131b and the magnetic field produced at the position of the second magnetic sensor 131a by the second measured current are equal. Also, the magnetic field produced at the position of the third magnetic sensor 132b and the magnetic field produced at the position of the fourth magnetic sensor 132a by the first measured current are equal.

Each of the pathways 301a to 301c and 302a to 302c may be straight, curved, of a combination of both.

The first pathway 301a is preferably a pathway connected to one end of the second pathway 301b, and starting from the end of the second pathway 301b, extending in a direction away from or in a direction approaching the third magnetic sensor 132b and the fourth magnetic sensor 132a. Consequently, the effect of the magnetic field that the first pathway 301a exerts on the third magnetic sensor 132b and the fourth magnetic sensor 132a becomes smaller. More preferably, the angle obtained between the first pathway 301a and the second pathway 301b is 90 degrees.

Similarly, the third pathway 301c is preferably a pathway connected to the other end of the second pathway 301b, and starting from the end of the second pathway 301b, extending in a direction away from or in a direction approaching the third magnetic sensor 132b and the fourth magnetic sensor 132a. More preferably, the angle obtained between the second pathway 301b and the third pathway 301c is 90 degrees.

The fourth pathway 302a is preferably a pathway connected to one end of the fifth pathway 302b, and starting from the end of the fifth pathway 302b, extending in a direction away from the first magnetic sensor 131b and the second magnetic sensor 131a. Consequently, the effect of the magnetic field that the fourth pathway 302a exerts on the first magnetic sensor 131b and the second magnetic sensor 131a becomes smaller. More preferably, the angle obtained between the fourth pathway 302a and the fifth pathway 302b is 90 degrees.

Similarly, the sixth pathway 302c is preferably a pathway connected to the other end of the fifth pathway 302b, and starting from the end of the fifth pathway 302b, extending in a direction away from the first magnetic sensor 131b and the second magnetic sensor 131a. More preferably, the angle obtained between the fifth pathway 302b and the sixth pathway 302c is 90 degrees.

In addition, if the first current pathway 301 curves to the left from the first pathway 301a to the second pathway 301b, the first current pathway 301 additionally curves to the left to form the third pathway 301c, whereas if the first current pathway 301 curves to the right from the first pathway 301a to the second pathway 301b, the first current pathway 301 additionally curves to the right to form the third pathway 301c. The second current pathway 302 is formed similarly to the first current pathway 301. The first magnetic sensor 131b is placed in the area enclosed by the first current pathway 301, while the third magnetic sensor 132b is placed in the area enclosed by the second current pathway 302.

In the present embodiment, the first current pathway 301 and the second current pathway 302 exist in an approximately point-symmetric positional relationship about an arbitrary point between the second pathway 301b and the fifth pathway 302b.

It is noted that insofar as the relationship of arrangement between the first current pathway 301 and the second current pathway 302 is approximately point-symmetric, the shape of each current pathway and the arrangement of the magnetic sensors is not limited to the example illustrated in FIG. 1, and can also be changed.

In a planar view, the third magnetic sensor 132b is placed on a virtual line c orthogonal to a line segment PP' joining the first magnetic sensor 131b and the second magnetic sensor 131a, at an arbitrary position between the first magnetic sensor 131b and the second magnetic sensor 131a along the line segment PP'. Similar to the third magnetic sensor 132b, in a planar view, the first magnetic sensor 131b is placed on a virtual line orthogonal at an arbitrary position between the third magnetic sensor 132b and the fourth magnetic sensor 132a along a line segment joining the third magnetic sensor 132b and the fourth magnetic sensor 132a.

In this way, the relationship of arrangement between the first current pathway 301 and the second current pathway 302 is approximately point-symmetric, and in addition, the median line of the line joining the first magnetic sensor 131*b* and the second magnetic sensor 131*a* is made to pass through the center of the fifth pathway 302*b*. Consequently, the respective magnetic flux (B21, B22) at the first magnetic sensor 131*b* and the second magnetic sensor 131*a* produced by the current from the second current pathway 302 become equal in magnitude and direction.

Here, B21 indicates the magnetic flux produced in the first magnetic sensor unit by the flow of current through the second current pathway 302, while B22 indicates the magnetic flux produced in the second magnetic sensor unit by the flow of current through the first current pathway 301.

Provided that B1 and B1' are the respective magnetic flux at the first magnetic sensor 131*b* and the second magnetic sensor 131*a* produced according to the current from the first current pathway 301, the difference phi between the magnetic flux received at the first magnetic sensor 131*b* and the second magnetic sensor 131*a* is expressed by the following expression, because B21=B22.

$$B1+B21 \text{ (first magnetic sensor)} - (-B1'+B22) \text{ (second magnetic sensor)} = B1+B1' \quad (1)$$

From the above Expression (1), the interference of the magnetic flux from the second current pathway may be canceled, thereby improving the accuracy of current detection.

The difference in the magnetic flux between the third magnetic sensor 132*b* and the fourth magnetic sensor 132*a* is similar to that indicated in the above Expression (1), and thus the interference of the magnetic flux from the fifth current pathway may be canceled between the third magnetic sensor 132*b* and the fourth magnetic sensor 132*a*, thereby improving the accuracy of current detection.

In addition, in the present embodiment, the median line between the first magnetic sensor 131*b* and the second magnetic sensor 131*a* preferably passes through the center part of the fifth pathway 302*b*. The median line of the line segment between the third magnetic sensor 132*b* and the fourth magnetic sensor 132*a* preferably passes through the center part of the second pathway 301*b*.

Here, the center part refers to the middle ⅓ of the fifth pathway 302*b* or the second pathway 301*b* when divided lengthwise into three equal portions.

More preferably, the magnetic sensors are positioned so that the normal line extending from the midpoint joining the first magnetic sensor 131*b* and the second magnetic sensor 131*a* intersects the midpoint of the fifth pathway 302*b*, and the normal line extending from the midpoint of the line joining the third magnetic sensor 132*b* and the fourth magnetic sensor 132*a* intersects the midpoint of the second pathway 301*b*.

As discussed later, the current sensor 1 of the present embodiment is a current sensor encapsulating multiple magnetic sensors 131*a*, 131*b*, 132*a*, and 132*b* that detect magnetic flux, a first conductor through which a first measured current flows, a second conductor through which a second measured current flows, a signal processing IC that processes the outputs from the magnetic sensors 131*a*, 131*b*, 132*a*, and 132*b*, and a lead frame that forms signal terminals.

Additionally, in the current sensor 1 of the present embodiment, the first conductor discussed later preferably includes a 7th conductor part (corresponding to the projecting part 14*a*_1 discussed later) having a gap with a 1st conductor part, arranged so as to enclose the second magnetic sensor 131*a*, and connected to a 2nd conductor part (corresponding to the second pathway 301*b*).

Alternatively, the first conductor discussed later preferably includes an 8th conductor part (corresponding to the projecting part 14*a*_2 discussed later) having a gap with the 2nd conductor part, arranged so as to enclose the second magnetic sensor 131*a*, and connected to the 1st conductor part (corresponding to the first pathway 301*a*).

Alternatively, the first conductor discussed later may be arranged so as to enclose the second magnetic sensor 131*a*, and configured to include an 11th conductor part connected to the 2nd conductor part (corresponding to the second pathway 301*b*) and a 12th conductor part connected to the 1st conductor part (corresponding to the first pathway 301*a*), with a gap provided between the 11th conductor part and the 12th conductor part.

Also, the second conductor discussed later preferably includes a 9th conductor part (corresponding to the projecting part 14*b*_1 discussed later) having a gap with a 4th conductor part (corresponding to the fourth pathway 302*a*), arranged so as to enclose the fourth magnetic sensor 132*a*, and connected to a 5th conductor part (corresponding to the fifth pathway 302*b*).

Alternatively, the second conductor discussed later preferably includes a 10th conductor part (corresponding to the projecting part 14*b*_2 discussed later) having a gap with the 5th conductor part, arranged so as to enclose the fourth magnetic sensor 132*a*, and connected to the 4th conductor part.

Alternatively, the second conductor discussed later may be arranged so as to enclose the second magnetic sensor 131*a*, and configured to include a 13th conductor part connected to the 4th conductor part (corresponding to the fourth pathway 302*a*) and a 14th conductor part connected to the 5th conductor part (corresponding to the fifth pathway 302*b*), with a gap provided between the 13th conductor part and the 14th conductor part.

By having the current sensor 1 additionally include the 7th to 10th conductor parts discussed above (projecting parts 14*a*_1, 14*b*_1, 14*a*_2 and 14*b*_2 discussed later), the first magnetic sensor 131*b* and the second magnetic sensor 131*a* become similarly affected by the heat produced by the current flowing through the first conductor, and since the third magnetic sensor 132*b* and the fourth magnetic sensor 132*a* are similarly affected by the heat produced by the current flowing through the second conductor, the difference in environmental temperature between the two is not obscured, thereby further improving the accuracy of current detection.

In the present embodiment, the arrangement pattern of the magnetic sensors 131*a*, 131*b*, and the first conductor is designated the first pattern. The arrangement pattern of the magnetic sensors 132*a*, 132*b* and the second conductor is designated the second pattern. In this case, the first pattern and the second pattern exist in an approximately point-symmetric positional relationship about an arbitrary point between the second pathway 301*b* and the fifth pathway 302*b* opposing the second pathway 301*b*. Hereinafter, specific embodiments of the current sensor 1 will be described in detail.

First Embodiment

Explanation will be hereinafter provided for a current sensor in the present embodiment with reference to FIGS. 2 to 7.

The current sensor 1 according to the embodiment is an IC package sensor with a hybrid structure made up of magnetic sensors, such as Hall effect sensors, for example, and a signal processing IC.

Figure 2:
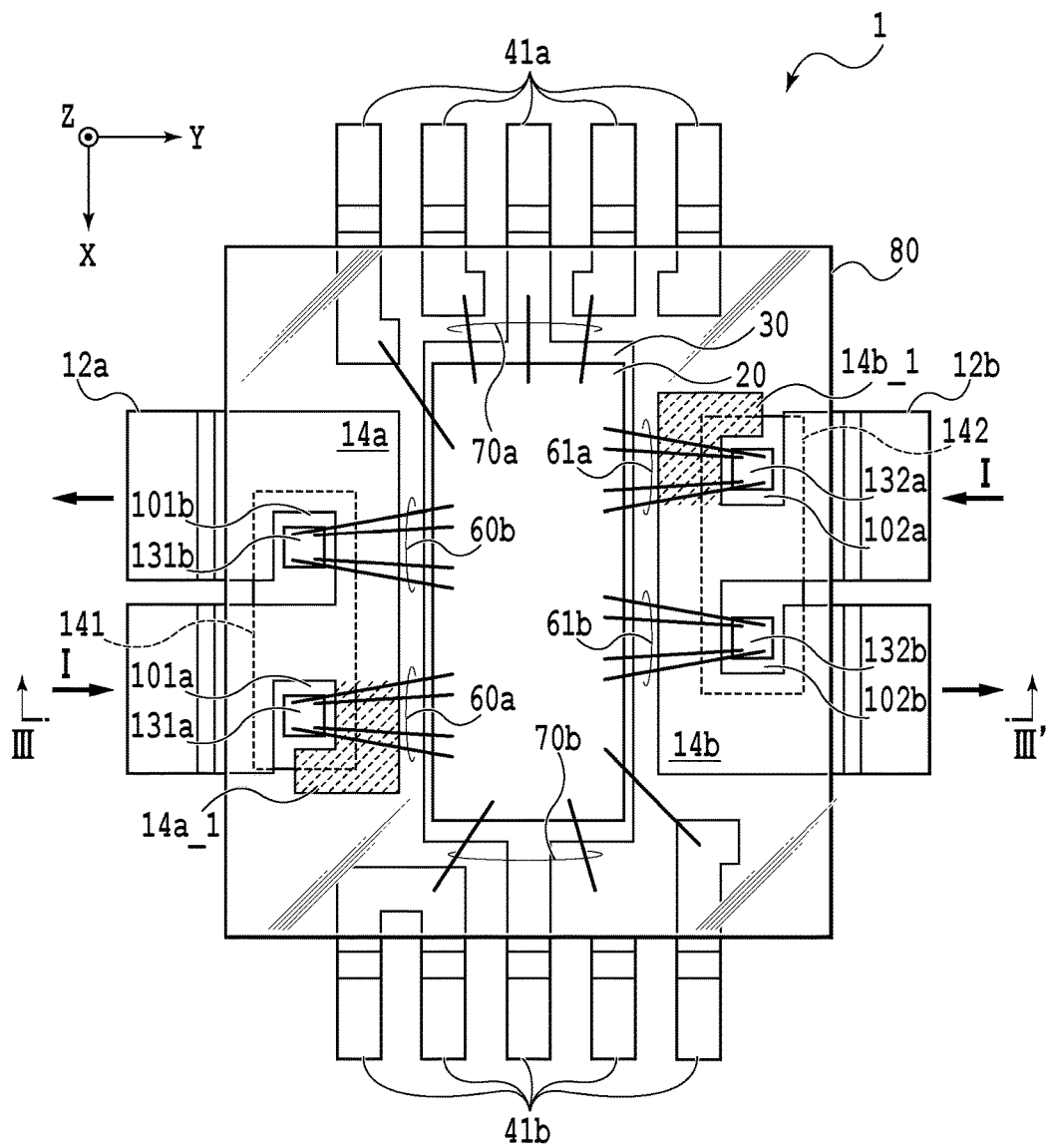
FIG. 2 is a diagram illustrating an example of the internal structure of a current sensor according to a first embodiment.

FIG. 2 is a diagram illustrating an example of the internal structure of the current sensor 1 according to the first embodiment.

The current sensor 1 corresponds to two current detection channels, and detects current according to the current from each channel. As illustrated in FIG. 2, the current sensor 1 is equipped with measured current terminals 12a and 12b which correspond to the inputs of the two channels, conductors 14a and 14b, magnetic sensors 131a, 131b, 132a and 132b, a signal processing IC 20 and signal terminals 41a and 41b. In the current sensor 1, the detection of the magnetic flux density in each channel is respectively conducted by the magnetic sensor group provided for each channel, or in other words, by the pair of magnetic sensors 131a and 131b, and by the pair of magnetic sensors 132a and 132b.

It is noted that the conductors 14a and 14b will be described in the form of a lead frame used in a semiconductor package, for example. Also, each of the measured current terminals 12a and 12b is made up of a current terminal that acts as the input of the measured current for the corresponding conductor, and a current terminal that acts as the output of the measured current.

In FIG. 2, the number of the signal terminals 41a and 41b is not limited to the example illustrated in FIG. 2, and may also be changed. Also, the number of magnetic sensors provided in each channel may also be three or more.

The conductor (first conductor) 14a is formed so that a measured current I from the measured current terminal 12a flows along a current pathway. In this embodiment, two gaps 101a and 101b are formed in the conductor 14a, for example, and the magnetic sensors 131a and 131b are arranged inside the gaps 101a and 101b, respectively. Consequently, the magnetic sensors 131a and 131b are configured to detect current according to the measured current I flowing through the conductor 14a. The above arrangement pattern of the magnetic sensors 131a, 131b and the first conductor is designated the first pattern.

Likewise, the conductor (second conductor) 14b is formed is formed so that a measured current I from the measured current terminal 12b flows. Additionally, the magnetic sensors 132a and 132b are arranged inside the gaps 102a and 102b of the conductor 14b, respectively. Consequently, the magnetic sensors 132a and 132b are configured to detect current according to the measured current I flowing through the conductor 14b. The above arrangement pattern of the magnetic sensors 132a, 132b and the second conductor is designated the second pattern.

The magnetic sensors 131a, 131b, 132a and 132b may be elements such as Hall effect sensors, magnetoresistive sensors, Hall effect ICs, or magnetoresistive ICs, for example.

In the current sensor 1 of the present embodiment, as illustrated in FIG. 2, the conductors 14a and 14b, the magnetic sensors 131a, 131b, 132a and 132b, and the signal processing IC 20 are encapsulated by a mold resin 80 such as epoxy resin, and formed as a single semiconductor package (hereinafter simply called the "package").

In the current sensor 1 of the present embodiment, measured currents I1 and I2 are made to flow along respective current pathways in the conductors 14a and 14b, but as the current of the measured current I1 becomes larger, more heat is generated in the conductor 14a, and the surrounding temperature of the magnetic sensor 131b enclosed by the conductor 14a becomes high compared to the magnetic sensor 131a. Since the magnetic sensors exhibit a temperature dependency, detection error for the current I1 occurs more readily when obtaining the difference between the outputs of the magnetic sensor 131b and the magnetic sensor 131a. Similarly, when the current of the measured current I2 becomes larger, more heat is generated in the conductor 14b, and the surrounding temperature of the magnetic sensor 132b enclosed by the conductor 14b becomes high compared to the magnetic sensor 132a, and detection error for the current I2 occurs more readily when obtaining the difference between the outputs of the magnetic sensor 132b and the magnetic sensor 132a.

From this perspective, in the current sensor 1 of the present embodiment, a projecting part 14a_1 (indicated by shading in FIG. 2; corresponds to the 7th conductor part) is provided so as to make the conductor 14a, which is the source of heat generation, enclose the second magnetic sensor 131a so that a large difference in the surrounding temperature of the magnetic sensors 131a and 131b is not produced. Similarly, a projecting part 14b_1 (indicated by shading in FIG. 2; corresponds to the 9th conductor part) is provided to so as to make the conductor 14b, which is the source of heat generation, so that a large difference in the surrounding temperature of the magnetic sensors 132a and 132b is not produced.

In the current sensor 1, if a measured current I flows through the conductor 14a or 14b, a magnetic field is produced according to the quantity and direction of the current flowing through the conductor 14a or 14b. In the present embodiment, the magnetic sensors 131a and 131b are arranged inside the gaps 101a and 101b, respectively. Additionally, in the example of FIG. 2 (planar view), each magnetic sensor 131b is arranged so as to be enclosed by the conductor 14a. Consequently, the position of the magnetic sensor 131b is affected by the measured current I from the conductor 14a and the magnetic field becomes strong, and as a result, the magnetic flux density is increased compared to the position of the magnetic sensor 131a.

In addition, the magnetic sensors 132a and 132b are arranged inside the gaps 102a and 102b, respectively, and positioned so as to be enclosed by the conductor 14b. Consequently, at the position of the magnetic sensor 132b, the magnetic field from the measured current I likewise becomes strong, and the magnetic flux density is increased compared to the position of the magnetic sensor 132a.

At the positions of the magnetic sensors 131a and 131b, the orientation of the magnetic flux formed by the measured current I is made to be different (in the negative or positive Z direction). Also, at the positions of the magnetic sensors 132a and 132b, the orientation of the magnetic flux formed by the measured current I is also made to be different (in the positive or negative Z direction). Consequently, in the current detection of each channel, by taking the difference in output between the magnetic sensors 131a and 131b and the difference in output between the magnetic sensors 132a and 132b, it becomes possible to obtain high output while also canceling out uniform magnetic noise of external origin.

The magnetic sensors 131a, 131b, 132a and 132b detect the magnetic flux density produced by the measured current I, and output electrical signals corresponding to the magnetic flux density to the signal processing IC 20.

In FIG. 2, the signal processing IC 20 is arranged on a lead frame 30 that forms the signal terminals 41a and 41b. In the current sensor 1, the respective magnetic sensors 131a, 131b, 132a and 132b as well as the signal processing IC 20 are configured inside the same package in a hybrid structure made up of respectively independent chips.

The magnetic sensors 131a and 131b are separated from the conductor 14a, and are always in a state of non-contact with the conductor 14a. Consequently, the space between the conductor 14a and the magnetic sensors 131a and 131b is not electrically conductive, and spacing (clearance) is secured to maintain insulation. Likewise, the magnetic sensors 132a and 132b are separated from the conductor 14b, and are always in a state of non-contact with the conductor 14b. Consequently, the space between the conductor 14b and the magnetic sensors 132a and 132b likewise is in a non-electrically-conductive state, and spacing (clearance) is secured to maintain insulation.

In FIG. 2, an insulating member 141 (indicated by a dashed line in FIG. 2) is provided to support the magnetic sensors 13a and 13b, and an insulating member 142 (indicated by a dashed line in FIG. 2) is provided to support the magnetic sensors 132a and 132b. For the insulating members 141 and 142, insulating tape made of a polyimide material having a high dielectric strength may be used, for example. Note that the material used as the insulating members 141 and 142 is not limited to polyimide tape, and an insulating sheet obtained by applying adhesive to an insulating member such as a polyimide material, a ceramic material, or a silicon substrate may also be applied, for example.

The magnetic sensors 131a and 131b are electrically connected to the signal processing IC 20 through wires (metal lines) 60a and 60b, while the magnetic sensors 132a and 132b are electrically connected to the signal processing IC 20 through wires 61a and 61b.

The signal processing IC 20 is electrically connected to the signal terminals 41a and 41b through wires 70a and 70b, respectively. The signal terminals 41a and 41b are configured to retrieve the output (current value) of the signal processing IC 20.

The signal processing IC 20 is realized by large-scale integration (LSI), for example, and in the present embodiment, is equipped with components such as memory, a processor, a bias circuit, a correction circuit and an amplification circuit, for example. The circuit configuration of the signal processing IC 20 will be described in detail later.

Figure 3:
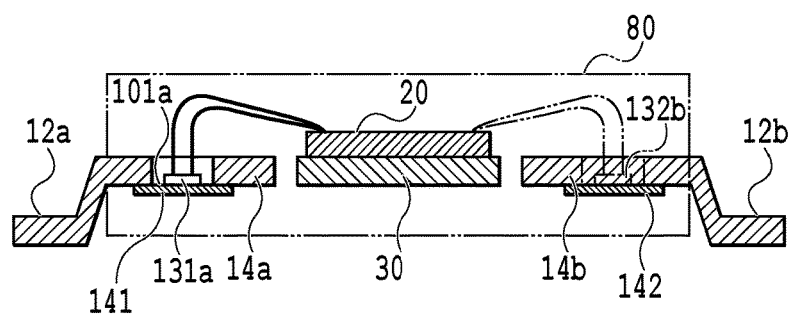
FIG. 3 is a diagram illustrating an example of a side view of the interior of the current sensor in FIG. 2.

FIG. 3 is a diagram illustrating an example of a side view of the interior of the current sensor 1.

The insulating member 141 is joined to part of the underside of the lead frame forming the conductor 14a, and is formed so as to support the magnetic sensors 131a and 131b (see FIGS. 2 and 3). In addition, the insulating member 142 is joined to part of the underside of the lead frame forming the conductor 14b, and is formed so as to support the magnetic sensors 132a and 132b (see FIGS. 2 and 3).

The insulating members 141 and 142 are made up insulating tape of a polyimide material with excellent voltage endurance, for example. In a state as illustrated in FIG. 3, the insulating members 141 and 142 are applied to the underside of the lead frame forming the conductors 14a and 14b, and support the magnetic sensors 131a, 131b, 132a, and 132b from the underside. The magnetic sensors 131a, 131b, 132a, and 132b may also be adhesively bonded to the insulating members 141 and 142 through an insulating material such as a die attach film, for example.

In FIG. 3, the magnetic sensor 131a is arranged inside the gap 101a formed in the conductor 14a, sunken in to the extent of the thickness of the lead frame forming the conductor 14a. Similarly, the magnetic sensors 131b, 132a, and 132b illustrated in FIG. 2 are also arranged inside the respective gaps 101b, 102a, and 102b formed in the conductors 14a and 14b, sunken in to the extent of the thickness of the lead frame forming the conductors 14a and 14b. Consequently, in the current sensor 1, since the vertical position of each magnetosensitive face of the magnetic sensors 131a, 131b, 132a and 132b is set in the height range from the bottom face to the top face of the lead frame (preferably, in the center), it becomes possible to sense more magnetic flux produced by the measured current I at each magnetosensitive face of the magnetic sensors 131a, 131b, 132a and 132b, and as a result, the current detection sensitivity is improved.

Figure 4A:
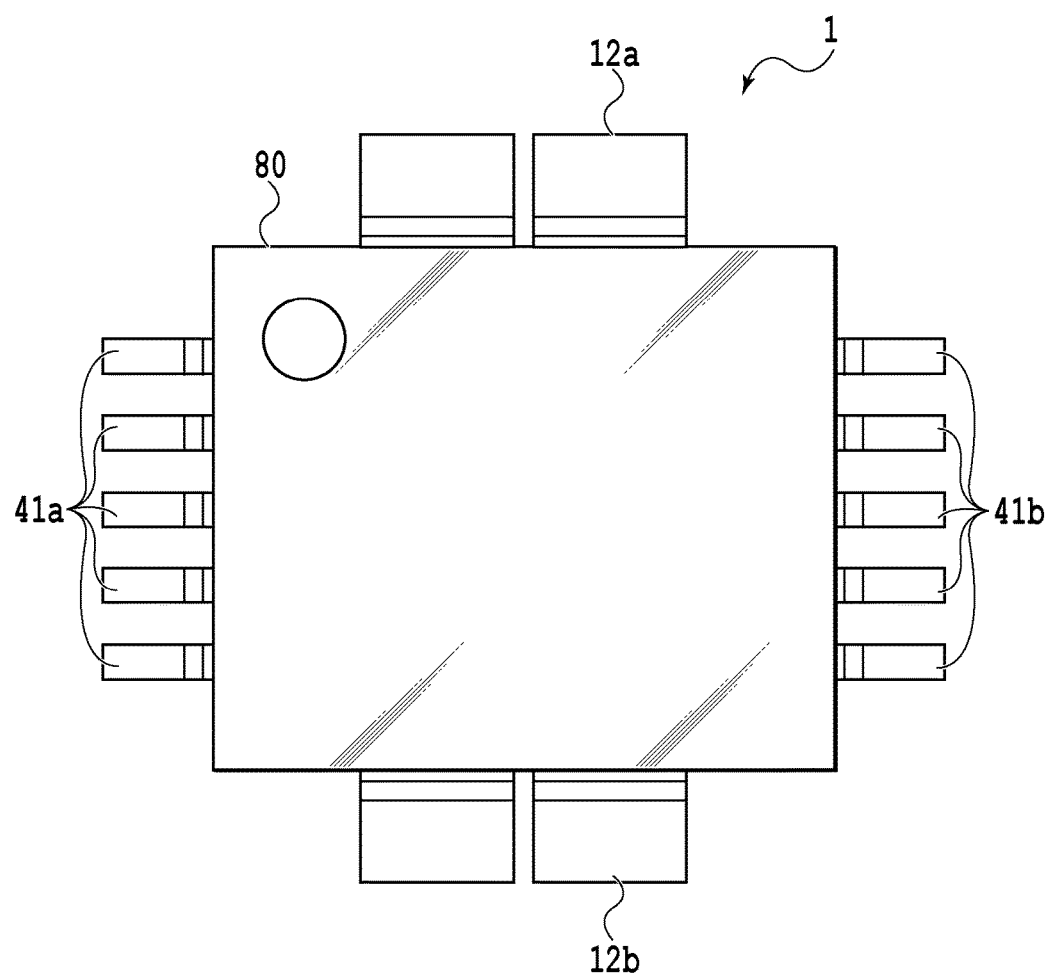
FIG. 4A is a diagram illustrating an example of the package exterior of the current sensor in FIG. 2.
Figure 4B:
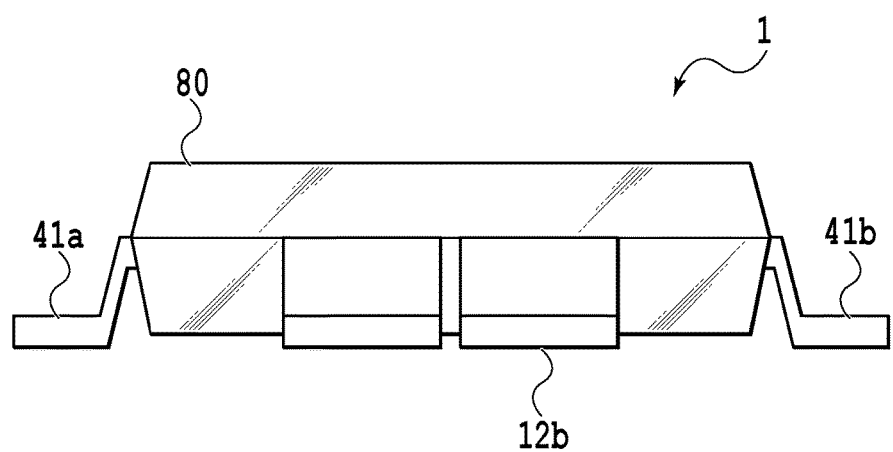
FIG. 4B is a diagram illustrating an example of the package exterior of the current sensor in FIG. 2.

FIG. 4A and FIG. 4B are diagrams illustrating an example of the package exterior of the current sensor 1, in which FIG. 4A is a package top view, and FIG. 4B is a package side view.

As illustrated in FIGS. 4A and 4B, the current sensor 1 is formed by being encapsulated by a mold resin 80.

The measured current terminals 12a and 12b as well as the signal terminals 41a and 41b are drawn out from the four sides of the package.

Figure 5A:
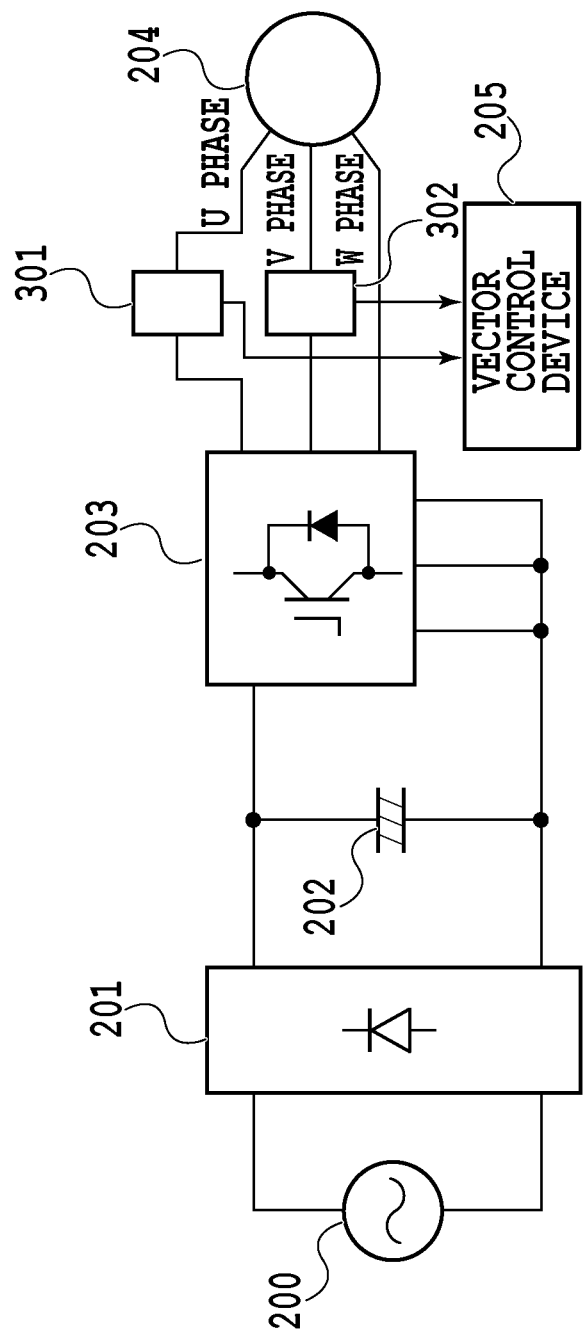
FIG. 5A is a diagram illustrating a current sensor according to a first embodiment conducting current detection of an electric motor.
Figure 5B:
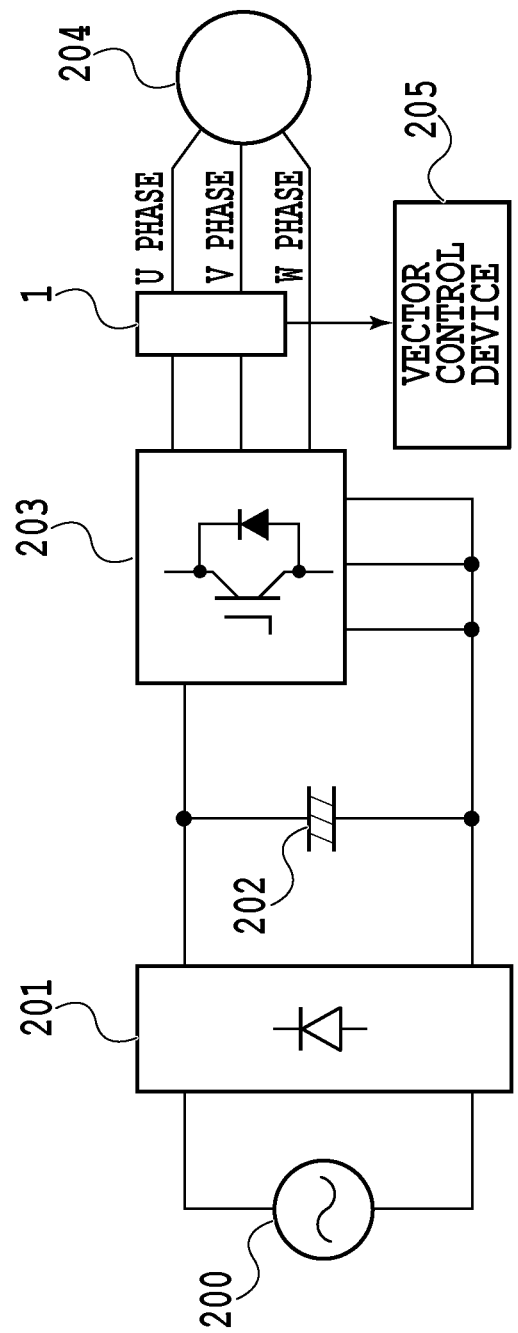
FIG. 5B is a diagram illustrating a current sensor according to a first embodiment conducting current detection of an electric motor.

Next, an overview in the case of connecting the current sensor 1 to an electric motor and conducting vector control of the electric motor will be described with reference to FIG. 5A and FIG. 5B. FIG. 5A and FIG. 5B are diagrams illustrating a case of the current sensor 1 conducting current detection of an electric motor 202, in which FIG. 5A illustrates an applied example of the related art, and FIG. 5B illustrates an applied example of the present embodiment.

The electric motor 204 illustrated in FIGS. 5A and 5B is a three-phase (U phase, V phase, W phase) induction motor. The electric motor 204 is subjected to vector control by a vector control device 205, in which current values for two phases (U phase and V phase) of the electric motor 204, or in other words, current values for two channels, are detected to perform vector control.

A converter unit 201 converts AC voltage from an AC power source 200 to DC voltage, and an inverter unit 203 converts the DC voltage to AC voltage. A capacitor 202 is configured to smooth out the converted DC voltage.

In the example of FIG. 5A, the U phase and V phase current values are detected by two current sensors 301 and 302, but in the example of FIG. 5B, the U phase and V phase current values are detected by the current sensor 1 of the present embodiment. This means that the current values of two channels may be detected with a single current sensor. Consequently, the current sensor installation space required to detect the current values of two channels is small compared to the related art, and a decrease in the space reserved for the current sensor may be realized. Also, since the arrangement between the two channels is fixed, it is possible to eliminate the effects on performance caused by positioning errors when mounting on a printed circuit board compared to the case of using two current sensors.

Figure 6:
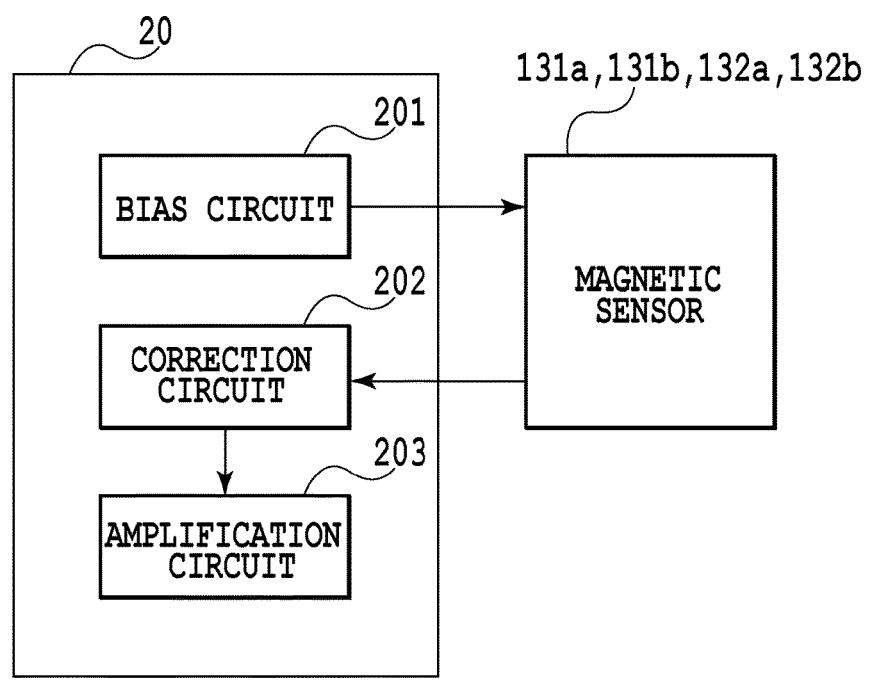
FIG. 6 is a function block diagram illustrating a configuration example of the interior of a signal processing IC.

FIG. 6 is a function block diagram illustrating the signal processing IC 20. The signal processing IC 20 is equipped with a bias circuit 201, a correction circuit 202 and an amplification circuit 203. The bias circuit 201 is connected to the magnetic sensors 131a, 131b, 132a and 132b, and is configured to supply power to the magnetic sensors 131a, 131b, 132a, and 132b. In other words, the bias circuit 201 is a circuit for impressing (causing an inflow of) an exciting current onto the magnetic sensors 131a, 131b, 132a and 132b.

The correction circuit 202 is configured to compute a current value by canceling out the effects of externally-produced magnetic fields (offsetting noise of the same phase), on the basis of the difference in output between the pair of magnetic sensors 131a and 131b. In addition, the correction circuit 202 is configured to compute a current value by canceling out the effects of externally-produced magnetic fields, on the basis of the difference in output between the pair of magnetic sensors 132a and 132b.

In addition, the correction circuit 202 is configured to correct the output values of the magnetic sensors 131a, 131b, 132a and 132b in accordance with a temperature correction coefficient pre-stored in memory, on the basis of the operating temperature, for example. For this reason, highly accurate current detection with little temperature dependence becomes possible.

The amplification circuit 203 is configured to amplify output values from the correction circuit 202.

Next, the positional relationship of the magnetic sensors 131a, 131b, 132a and 132b will be described with reference to FIG. 7.

Figure 7:
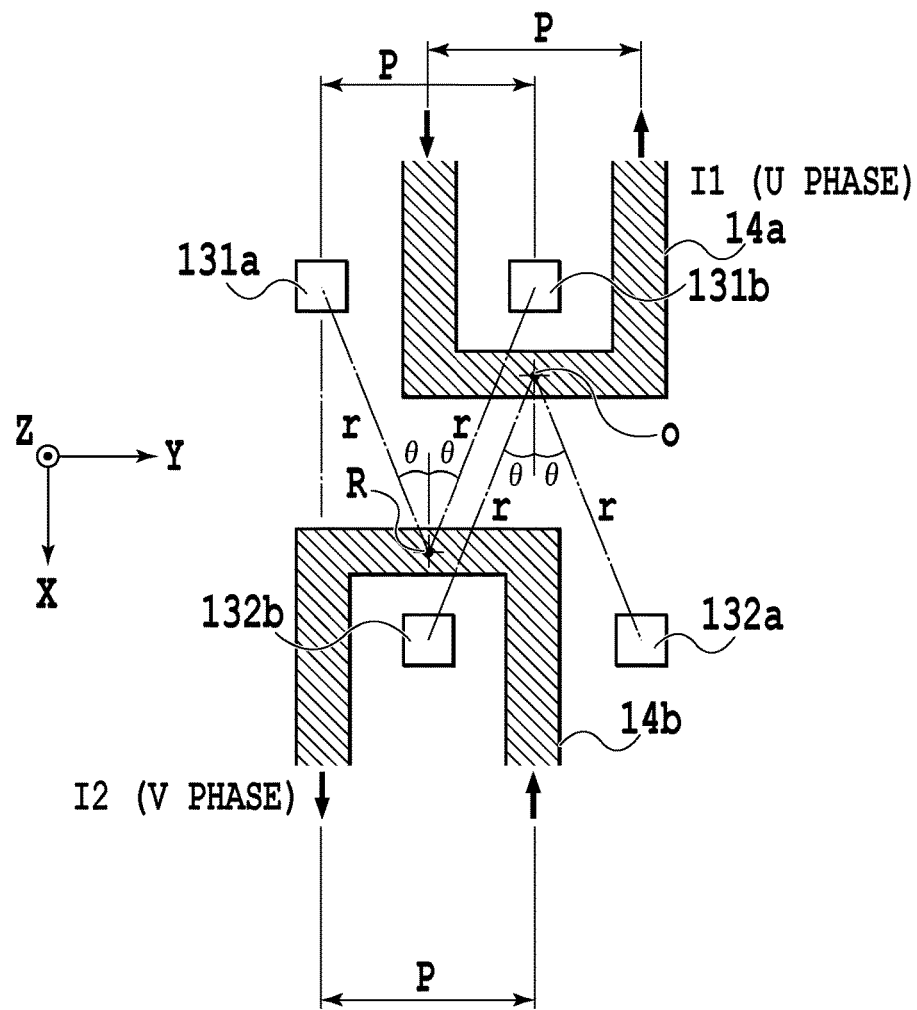
FIG. 7 is a block diagram illustrating the positional relationship of respective magnetic sensors in a current sensor according to a first embodiment.

FIG. 7 is a diagram illustrating the positional relationship of the magnetic sensors 131a, 131b, 132a and 132b.

As illustrated in FIG. 7, in the current sensor 1, the conductors 14a and 14b correspond to the inputs of the U phase and V phase channels, respectively, and are formed so that measured currents I1 (U phase) and I2 (V phase) flow along sideways-U-shaped current pathways.

The magnetic sensors 131a and 131b are arranged in parallel in the Y direction, spaced a designated interval away from the magnetic sensors 132a and 132b.

In FIG. 7, let P be the interval between the magnetic sensors 131a and 131b, and also the interval between the magnetic sensors 132a and 132b. This P is the same as the interval between the conductor parts having mutually opposing current pathways (conductor parts in which the flow directions of the current I are different from each other).

As illustrated in FIG. 7, the magnetic sensors 131a and 131b are respectively arranged with a shift in the Y direction with respect to each of the magnetic sensors 131a and 131b, such as a shift of ½P, for example.

The magnetic sensors 131a and 131b are arranged to be at positions at an equal distance r away from a point R on the conductor 14b. The point R represents the midpoint on the side of the conductor 14b formed in the Y direction. In this case, at the respective positions of the magnetic sensors 131a and 131b, the magnitude of the magnetic flux from the current I2 flowing through the conductor 14b becomes the same, and thus by taking the difference between the magnetic sensors 131a and 131b, it is possible to completely cancel out the effects from the conductor 14b. In other words, mutual interference between the channels may be avoided.

Additionally, the magnetic sensors 132a and 132b are arranged to be at positions at an equal distance r away from a point O on the conductor 14a. The point O represents the midpoint on the side of the conductor 14a formed in the Y direction. In this case, at the respective positions of the magnetic sensors 132a and 132b, the value of the magnetic flux from the current I1 flowing through the conductor 14a likewise becomes the same, and thus by taking the difference between the magnetic sensors 132a and 132b, it is possible to completely cancel out the effects from the conductor 14b. In other words, likewise in this case, mutual interference of magnetic flux between the channels may be avoided.

As described above, according to the current sensor 1 of the present embodiment, current detection in two channels may be conducted.

In addition, in the current sensor 1, for each channel, the magnetic sensors 131a, 131b, 132a and 132b detect magnetic flux of opposite orientation, thereby enabling difference detection. Consequently, since uniform magnetic noise of external origin may be canceled out for each channel, the current detection accuracy of the current sensor 1 may be improved.

Furthermore, in the current sensor 1, the magnetic sensors 131a, 131b, 132a and 132b are positioned so that mutual interference between the channels is not produced on the basis of the positional relationship between the magnetic sensors 131a, 131b, 132a, and 132b and each channel. For this reason, mutual interference of magnetic flux between the channels may be avoided, enabling an increase in channels even with a coreless current sensor.

Second Embodiment

Next, explanation will be hereinafter provided for a current sensor 1A in the present embodiment with reference to FIGS. 8 and 9.

The current sensor 1 discussed above is described as a hybrid structure of magnetic sensors and a signal processing IC as an example, but a silicon monolithic structure in which the magnetic sensors and the signal processing IC are formed integrally on the same silicon wafer may also be applied.

Figure 8:
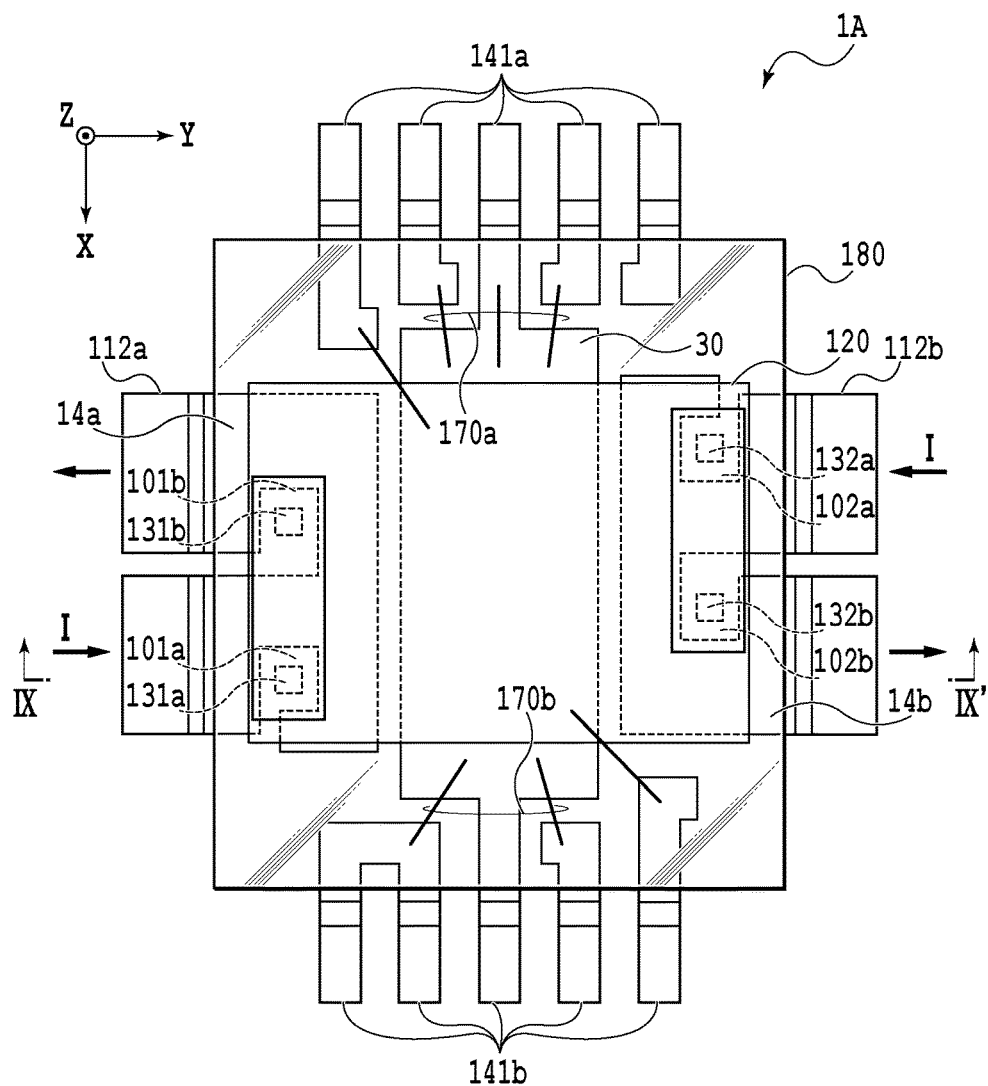
FIG. 8 is a diagram illustrating an example of the internal structure of a current sensor according to a second embodiment.

FIG. 8 illustrates a current sensor 1A including conductors 14a and 14b similar to FIG. 1 as an example of a current sensor 1A formed using such a monolithic structure. FIG. 9 is a diagram illustrating an example of a side view of the same current sensor 1A as FIG. 8.

Figure 9:
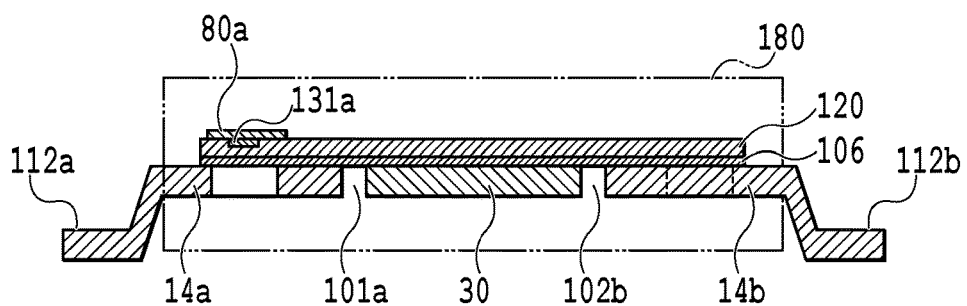
FIG. 9 is a diagram illustrating an example of a side view of the interior of the current sensor in FIG. 8.

In FIGS. 8 and 9, besides the monolithic structure, the present embodiment is similar to that illustrated in FIGS. 2 and 3. Hereinafter, a configuration of the current sensor 1A of the present embodiment will be described primarily in terms of the differences from that which is illustrated in FIGS. 2 and 3.

In the configuration example in FIGS. 8 and 9, a signal processing IC 120 is stacked on top of the conductor 14a via an insulating material 106 (for example, die attach film). The signal processing IC 120 is arranged on top of the lead frame that forms signal terminals 141a and 141b.

As illustrated in FIG. 8, the four magnetic sensors 131a, 131b, 132a, and 132b are arranged in the respective gaps 101a, 101b, 102a and 102b of the conductors 14a and 14b in the planar view, similar to that illustrated in FIG. 2. Additionally, the magnetic sensors 131a, 131b, 132a, and 132b are arranged so as to be enclosed by the corresponding conductors 14a and 14b, respectively, and are configured to detect the magnetic flux corresponding to the measured current I flowing through the conductors 14a and 14b.

However, in the present embodiment, since the magnetic sensors 131a, 131b, 132a and 132b and the signal processing IC 120 have a silicon monolithic structure formed integrally on a silicon wafer, the magnetic sensors 131a, 131b, 132a and 132b are formed inside the signal processing IC 120, as illustrated in FIG. 9.

In this case, the magnetic sensors 131a and 131b are arranged above the gaps 101a and 101b, respectively, and detect the magnetic flux produced on the basis of the measured current I flowing through the conductor 14a. Also, the magnetic sensors 132a and 132b are arranged above the gaps 102a and 102b, respectively, and detect the magnetic flux produced on the basis of the measured current I flowing through the conductor 14b.

In FIGS. 8 and 9, in the current sensor 1A, the conductors 14a and 14b, the magnetic sensors 131a, 131b, 132a and 132b, and the signal processing IC 20 are formed as a single semiconductor package encapsulated by a mold resin 180 such as epoxy resin.

In the present embodiment, magnetic materials 80a and 80b are formed on top of the magnetosensitive faces of the magnetic sensors 131a, 131b, 132a and 132b by magnet plating, for example. Note that, as a configuration example of the magnetic materials 80a and 80b, magnet chips such as ferrite are acceptable. Consequently, when the measured current I flows through the conductors 14a and 14b, the magnetic flux produced by the measured current I converges more readily on the magnetosensitive parts of the magnetic sensors 131a, 131b, 132a and 132b. Consequently, the current detection sensitivity of the current sensor 1A is improved.

Also, in the current sensor 1A, if a measured current I flows through the conductors 14a and 14b, the magnetic sensors 131a, 131b, 132a and 132b detect magnetic flux of opposite orientation according to the orientation of the measured current I flowing through the corresponding conductor 14a or 14b. Consequently, similarly to the configuration of the first embodiment, during current detection, the difference in magnetic flux between corresponding pairs of the magnetic sensors 131a, 131b, 132a and 132b may be utilized to cancel out the effects of magnetic disturbances.

Also, in the current sensor 1A of the present embodiment, the magnetic sensors 131a, 131b, 132a and 132b likewise are arranged so that mutual interference of magnetic flux between channels is not produced, similarly to that illustrated in FIG. 7. Thus, the current in two channels may be detected with high accuracy even with a coreless current sensor.

Next, modifications of the second embodiment will be described.

[Modification 1]

In the current sensor 1A illustrated in FIG. 8, the lead frame 30 that forms the signal terminals 141a and 141b is set to the same height as the conductors 14a and 14b, but advantageous effects similar to the second embodiment are also obtained if the lead frame 30 is configured to be higher than the conductors 14a and 14b. A current sensor configured in this way is illustrated in FIG. 10.

Figure 10:
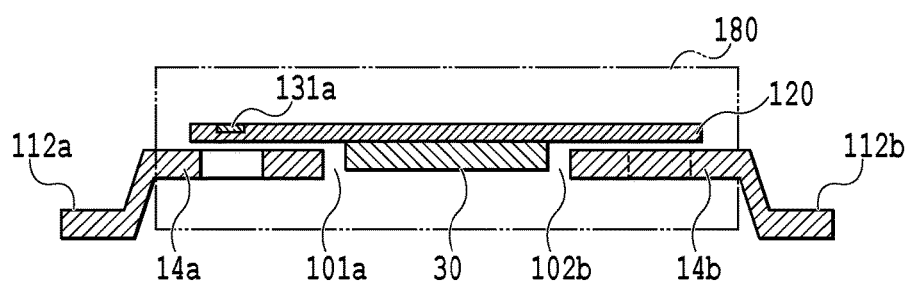
FIG. 10 is a diagram illustrating an example of a side view of the interior of a current sensor configured so that the lead frame on the signal terminal side is higher than the lead frame on the measured current terminal side.

In the current sensor illustrated in FIG. 10, the lead frame 30 is configured to be higher than the conductors 14a and 14b.

[Modification 2]

The measured current terminals 112a and 112b illustrated in FIG. 8 may also be configured so that the conductors 14a and 14b are lower than the lead frame 30 that forms the signal terminals 141a and 141b. A current sensor configured in this way is illustrated in FIG. 11.

Figure 11:
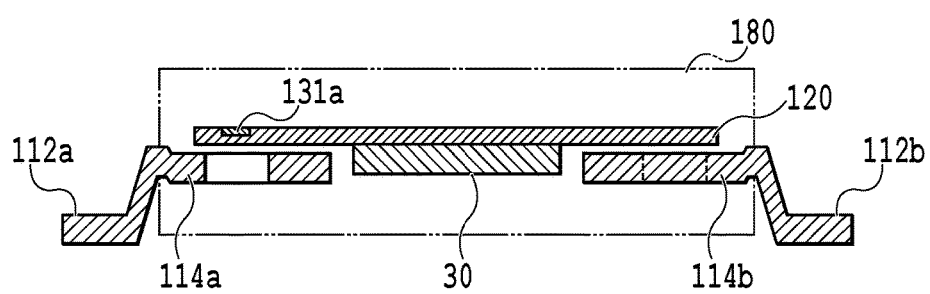
FIG. 11 is a diagram illustrating an example of a side view of the interior of a current sensor configured so that the lead frame on the measured current terminal side is lower than the lead frame on the signal terminal side.

In the current sensor illustrated in FIG. 11, the measured current terminals 112a and 112b are set lower than that illustrated in FIG. 8, thereby causing the conductors 114a and 114b to be lower than the lead frame 30. Even when configured in this way, the conductors 114a and 114b are in a state of non-contact with the lead frame 30, and advantageous effects similar to the second embodiment are obtained.

Third Embodiment

Next, explanation will be hereinafter provided for a current sensor 1B in the third embodiment with reference to FIG. 12.

The current sensors 1 and 1A discussed above are described by taking an example of a structure in which the current detection functions are encapsulated inside an IC package, but a module structure in which each structural element is configured by using discrete components on a substrate may also be applied.

Figure 12:
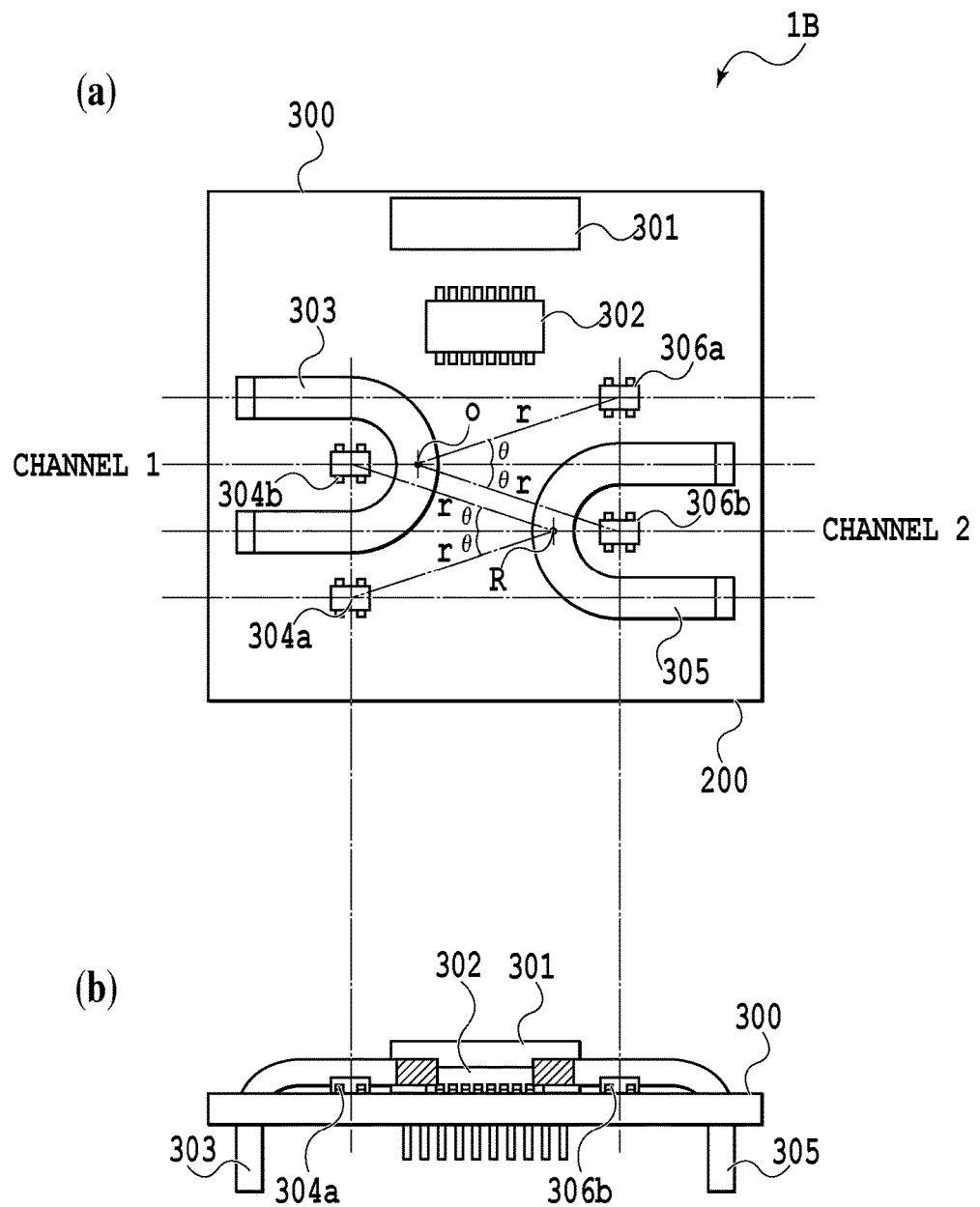
FIG. 12 is a diagram illustrating a configuration example of a current sensor according to a third embodiment.

FIG. 12 is a configuration example of a current sensor 1B formed by such a module structure, in which (a) is a front view and (b) is a side view.

As illustrated in FIG. 12, the current sensor 1B is equipped with a substrate 300. On the substrate 300, there are provided a signal connector 301, a signal processing IC 302, conductors 303 and 305 corresponding to the inputs of two channels 1 and 2, and magnetic sensors 304a, 304b, 306a and 306b. The conductors 303 and 305 respectively correspond to the conductors 14a and 14b illustrated in FIG. 1, and the magnetic sensors 304a, 304b, 306a, and 306b respectively correspond to the magnetic sensors 131a, 131b, 132a and 132b illustrated in FIG. 2. The signal processing IC 302 corresponds to the signal processing IC 20 illustrated in FIG. 2.

In the present embodiment, the positional relationship of the magnetic sensors 304a, 304b, 306a and 306b is the same as that illustrated in FIG. 7. In this case, the magnetic sensors 304a and 304b are arranged to be at positions at an equal distance r away from a point R on the conductor 305. Additionally, the magnetic sensors 306a and 306b are arranged to be at positions at an equal distance r away from a point O on the conductor 303. Consequently, mutual interference of magnetic flux between the channels 1 and 2 may be avoided.

In addition, in the current sensor 1B of the present embodiment, current detection in two channels may also be conducted, similarly to the first embodiment.

Furthermore, in the current sensor 1B, for each channel, the magnetic sensors 304a, 304b, 306a and 306b likewise detect magnetic flux of opposite orientation, thereby enabling difference detection. Consequently, since magnetic noise of external origin may be canceled out, the current detection accuracy of the current sensor 1B may be improved.

[Modifications]

The current sensors 1 to 1B according to the respective embodiments discussed above are merely examples for the sake of illustration, and modifications as indicated below are also possible.

Figure 13:
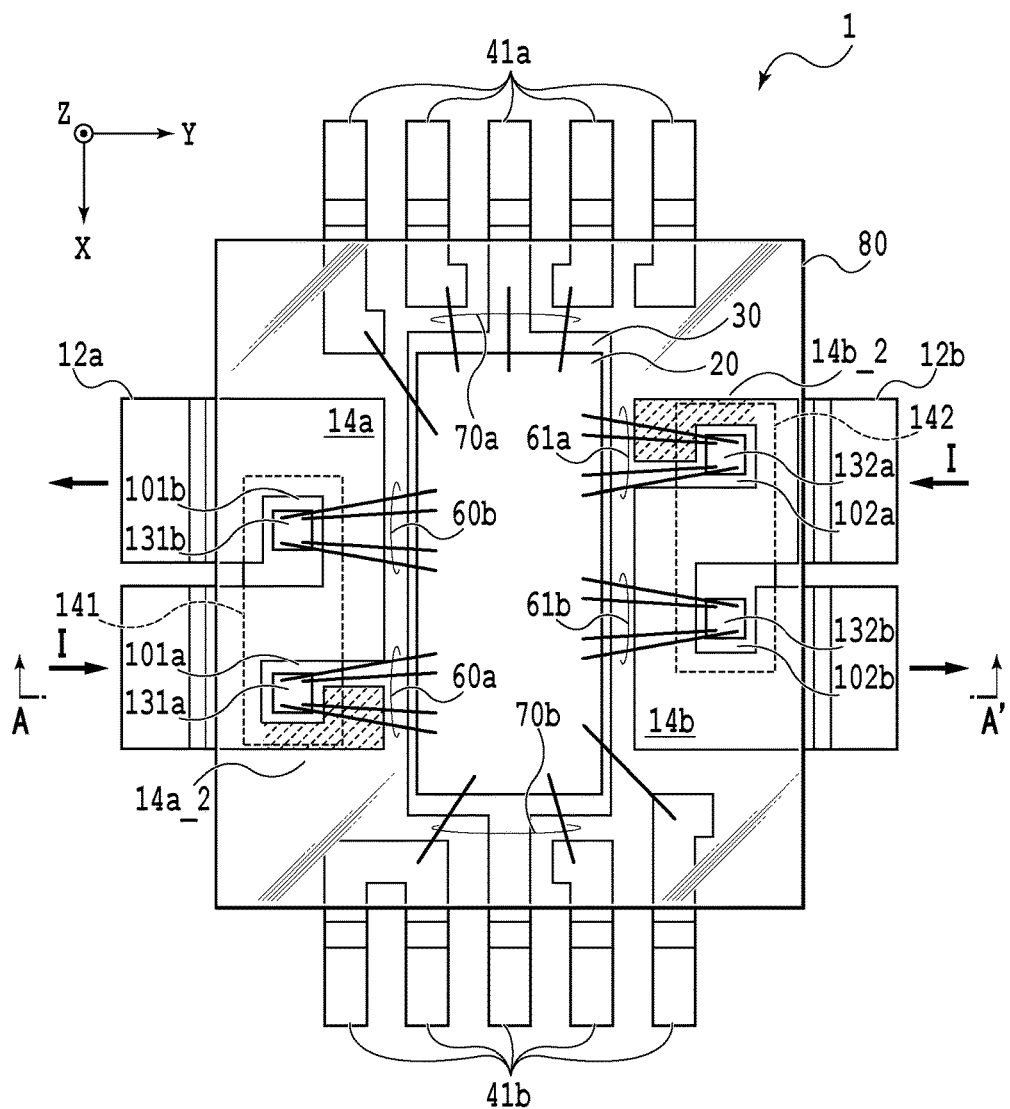
FIG. 13 is a diagram illustrating an example modification of a projecting part in a current sensor according to a first embodiment.

The projecting parts 14a_1 and 14b_1 of the first embodiment may also be formed as illustrated in FIG. 13, for example. The projecting part (8th conductor part) 14a_2 in FIG. 13 has a gap 101a with the 2nd conductor part of the conductor 14a (corresponding to the second pathway 301b in FIG. 1), is arranged so as to enclose the magnetic sensor 131a, and is formed to connect to the 1st conductor part (corresponding to the first pathway 301a in FIG. 1). The projecting part (10th conductor part) 14b_2 in FIG. 13 has a gap 102a with the 5th conductor part of the conductor 14b (corresponding to the fifth pathway 302b in FIG. 1), is arranged so as to enclose the magnetic sensor 132a, and is formed to connect to the 4th conductor part (corresponding to the fourth pathway 302a in FIG. 1). Even with such a configuration, advantageous effects similar to those illustrated in the first embodiment may be obtained.

The sizes and shapes of the conductors 14a, 14b, 303 and 305 in each embodiment may also be modified according to the specifications of the current sensor. The conductors 14a, 14b, 303 and 305 may be sideways-U-shaped or U-shaped.

Fourth Embodiment

Figure 14A:
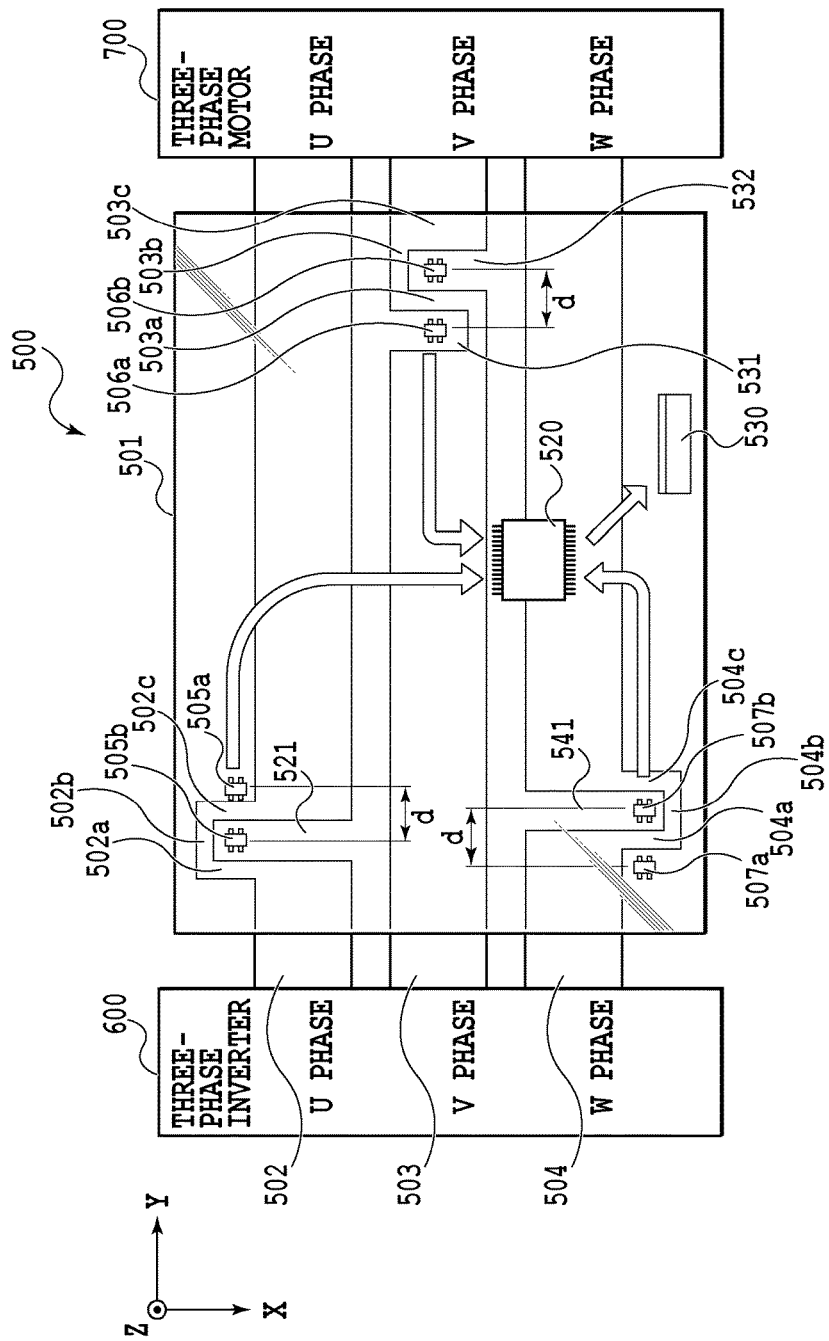
FIG. 14A is a diagram illustrating a configuration example of a current sensor according to a fourth embodiment.
Figure 14B:
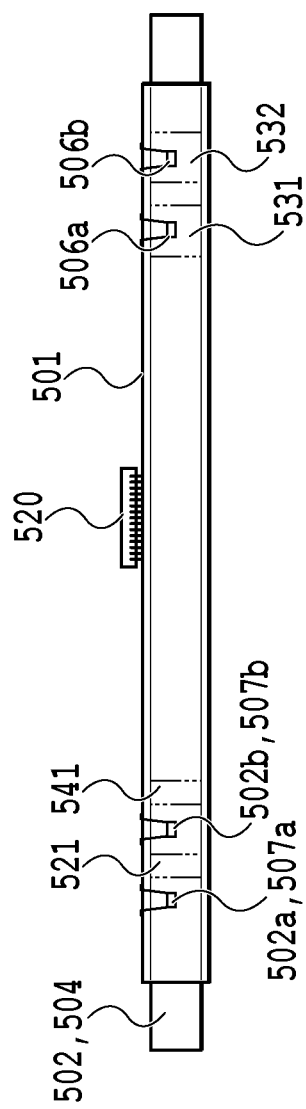
FIG. 14B is a diagram illustrating a configuration example of a current sensor according to a fourth embodiment.

The foregoing does not discuss the case of providing two magnetic sensors for each phase of a three-phase alternating current system to detect current values for three phrases, but in the present embodiment, the current sensor may be configured to detect current values for three phases. FIG. 14A and FIG. 14B are configuration examples of a current sensor 500 according to the fourth embodiment, in which FIG. 14A illustrates the internal structure of the current sensor 500, and FIG. 14B illustrates a side view of the current sensor 500. The current sensor 500 is a module-type current sensor including a printed circuit board for mounting magnetic sensors such as Hall effect sensors and a signal processing IC, and conductors through which measured current flows, for example (this also applies similarly to the description of the embodiments hereinafter).

In the example illustrated in FIG. 14A, two magnetic sensors are provided for each of three phases (U phase, V phase, W phase). In other words, two magnetic sensors 505a and 505b are provided in correspondence with the U phase, two magnetic sensors 506a and 506b are provided in correspondence with the V phase, and two magnetic sensors 507a and 507b are provided in correspondence with the W phase.

In FIG. 14A and FIG. 14B, the two magnetic sensors corresponding to each phase are positioned so that the orientation of the magnetic flux formed by the measured current is different, similarly to the first embodiment.

In FIGS. 14A and 14B, on the printed circuit board 501, the above magnetic sensors 505a, 505b, 506a, 506b, 507a and 507b corresponding to each phase and a signal processing IC 520 are mounted, and in addition, printed traces are formed.

The conductors 502, 503 and 504 of each phase are busbars, for example, and are connected to a three-phase inverter 600 and a three-phase motor 700. For example, when described in terms of the example illustrated in FIG. 14A and FIG. 14B, the busbars 502 to 504 and the printed circuit board 501 are formed integrally. Hereinafter, the above will be designated the busbar board.

In the busbar board of the present embodiment, both the front and rear faces of the busbars are covered by the printed circuit board 501. In this case, since the busbars 502 to 504 are embedded inside the printed circuit board 501, components may be mounted on both faces of the printed circuit board 501, and in addition, a high dielectric strength between the mounted components and busbars may be maintained.

The signal processing IC 520 is electrically connected to the magnetic sensors 505a, 505b, 506a, 506b, 507a, 507b and the connector 530, and is able to compute current values for three phases and output computed current values externally. In this case, the signal processing IC 20 is likewise equipped with a bias circuit 201, a correction circuit 202 and an amplification circuit 203, similarly to the first embodiment (FIG. 6). For example, in the example of FIG. 14A and FIG. 14B, the bias circuit 201 is a circuit for impressing (causing an inflow of) an exciting current onto the magnetic sensors 505a, 505b, 506a, 506b, 507a and 507b.

The correction circuit 202 is configured to compute a current value by canceling out the effects of externally-produced magnetic fields (offsetting noise of the same phase), on the basis of the difference in output between the pair of magnetic sensors corresponding to each phase. In addition, the correction circuit 202 is configured to compute a current value by canceling out the effects of externally-produced magnetic fields, on the basis of the difference in output between each pair of magnetic sensors. In addition, the correction circuit 202 is configured to correct the output values of the magnetic sensors 505a, 505b, 506a, 506b, 507a and 507b in accordance with a temperature correction coefficient pre-stored in memory, on the basis of the operating temperature, for example. For this reason, highly accurate current detection with little temperature dependence becomes possible. The amplification circuit 203 is configured to amplify output values from the correction circuit 202, similarly to that illustrated in FIG. 6.

[Arrangement of Magnetic Sensors]

Next the arrangement of the magnetic sensors 505a, 505b, 506a, 506b, 507a and 507b realized by the current sensor 500 will be described with reference to FIGS. 1 and 14A and 14B.

The magnetic sensors 505a and 505b are arranged in correspondence with the first current pathway of the U-phase busbar 502. Similar to that illustrated in FIG. 1, in the example of FIG. 14A and FIG. 14B, the busbar 502 includes a first pathway 502a, a second pathway 502b curving from the first pathway 502a and a third pathway 502c additionally curving from the second pathway 502b. The magnetic sensors 505a and 505b are arranged with the third pathway 502c disposed in between. This arrangement pattern of the magnetic sensors 505a and 505b is designated the first pattern.

The above pathways 502a to 502c are formed along the shape of a cutout 521. The magnetic sensor 505a is arranged on the outer side of the cutout 521, while the magnetic sensor 505b is arranged on the inner side of the cutout 521.

The magnetic sensors 507a and 507b are arranged in correspondence with the third current pathway of the W-phase busbar 504. Similar to that illustrated in FIG. 1, in the example of FIG. 14A and FIG. 14B, the busbar 504 includes a fourth pathway 504a, a fifth pathway 504b curving from the fourth pathway 504a, and a sixth pathway 504c additionally curving from the fifth pathway 504b. The magnetic sensors 507a and 507b are arranged with the fourth pathway 504a disposed in between. In the present embodiment, the arrangement pattern of the magnetic sensors 507a and 507b is designated the second pattern.

The above pathways 504a to 504c are formed along the shape of a cutout 541. The magnetic sensor 507a is arranged on the outer side of the cutout 541, while the magnetic sensor 507b is arranged on the inner side of the cutout 541.

The first pattern (first current pathway) and the second pattern (second current pathway) are formed similarly to that illustrated in FIG. 1 to eliminate magnetic flux interference between channels. In other words, the first current pathway and the second current pathway exist in an approximately point-symmetric positional relationship about an arbitrary point between the second pathway 502b and the fifth pathway 504b. Furthermore, in the planar view of FIG. 14A, the magnetic sensor 507a is arranged on a virtual line orthogonal, at an arbitrary position, to a line segment joining the magnetic sensor 505a and the magnetic sensor 505b. Furthermore, in the planar view of FIG. 14A, the magnetic sensor 505b likewise is arranged on a virtual line orthogonal, at an arbitrary position, to a line segment joining the magnetic sensor 507a and the magnetic sensor 507b.

In FIG. 14A and FIG. 14B, the magnetic sensors 506a and 506b are arranged in correspondence with the third current pathway of the V-phase busbar 503. In the example of FIG. 14A and FIG. 14B, the busbar 503 includes a seventh pathway 503a, an eighth pathway 503b curving from the seventh pathway 503a, and a ninth pathway 50cc additionally curving from the eighth pathway 50cb. The magnetic sensors 506a and 506b are arranged with the seventh pathway 503a disposed in between. In the present embodiment, the arrangement pattern of the magnetic sensors 506a and 506b is designated the third pattern.

The above pathways 503a to 503c are formed along the shapes of cutouts 531 and 532. The magnetic sensor 506a is arranged on the inner side of the cutout 531, while the magnetic sensor 506b is arranged on the inner side of the cutout 532.

The magnetic sensors 506a and 506b illustrated in FIG. 14A are arranged to be parallel to the pairs of magnetic sensors (505a, 505b) and (507a, 507b) for the U phase and the W phase, respectively. This arrangement is designated the third pattern.

At this point, if the distance between the U-phase magnetic sensor 505a and the V-phase magnetic sensor 506a is sufficiently long compared to the distance d between the two U-phase magnetic sensors 505a and 505b, the effects that the magnetic flux produced by current from the V-phase busbar 503 exerts on the current detection of the magnetic sensors 505a and 505b may be ignored. Similarly, if the distance between the W-phase magnetic sensor 507a and the V-phase magnetic sensor 506a is sufficiently long compared to the distance d between the two W-phase magnetic sensors 507a and 507b, the effects that the magnetic flux produced by current from the V-phase busbar 503 exerts on the current detection of the magnetic sensors 507a and 507b may be ignored. In other words, in the current sensor 500, the magnetic sensors are arranged so that the mutual interference of magnetic flux between the channels may be reduced. Consequently, the current sensor 500 is able to accurately detect current in three channels.

In FIG. 14A, for example, in the current pathways of the busbars 502 and 504 for two phases (U phase and W phase), the first current pathway and the second current pathway are arranged with a d/2 shift in the Y direction (the direction along which the conductor of each phases extends) with respect to the interval d between the pair of magnetic sensors in each phase (U phase and W phase), whereas the third current pathway of the busbar 503 for the remaining phase (V phase) is arranged with a shift in the Y direction so as to be separated at a distance of at least double the interval d between the pair of magnetic sensors. Consequently, between the U phase and the W phase, the difference in output between two magnetic sensors may be calculated to cancel out the effects of the mutually interfering magnetic fields, similarly to that illustrated in FIG. 1. Furthermore, between the U phase and the V phase (and similarly between the W phase and the V phase), the effects of the magnetic flux produced by current flowing through the straight seventh pathway 503a are small at the position of the pair of magnetic sensors.

In FIG. 14A, provided that d is the interval between the pair of magnetic sensors for each phase, the cutout in the busbar of adjacent phase is formed at a distance of at least double the interval d away along the Y direction. Consequently, in the magnetic sensors of each phase, it is possible to decrease the effects of current flowing through the other phases.

In FIG. 14B, the magnetic sensors 505a, 505b, 506a, 506b, 507a and 507b are arranged inside penetrating slits, with the magnetosensitive part sunken farther inward than the mounting face of the busbar board. As a result, the magnetosensitive part of each magnetic sensor is arranged near the center of thickness of the busbars. Consequently, in the current sensor 500, it becomes possible to sense more magnetic flux produced by the measured current I at each magnetosensitive face of the magnetic sensors 131a, 131b, 132a and 132b, and as a result, the current detection sensitivity is improved.

Note that the penetrating slits discussed above penetrate the busbars 502 to 504 and the board prepreg, and the inner walls of the penetrating slits are formed by the above board prepreg so that the busbars 502 to 504 are not exposed. Consequently, high insulation performance between the components mounted inside the busbar board and the busbars 502 to 504 may be maintained.

Note that although the above describes an example of arranging the magnetosensitive parts of the magnetic sensors sunken into the inner side of the mounting face of the busbar board, the magnetic sensors may also be arranged on the mounting face of the busbar board. In the case of mounting the magnetic sensors on the mounting face of the busbar board, processing of the busbar board becomes unnecessary.

In FIG. 14B, in the busbar board, both the front and rear faces of the busbars 502 to 504 are covered by the printed circuit board 501. Consequently, by embedding the busbars 502 to 504 into the printed circuit board 501, components may be mounted on both faces of the busbar board.

Fifth Embodiment

In a current sensor 500A of the fifth embodiment, the shapes of the busbars 502, 503 and 504 may also be modified.

Figure 15:
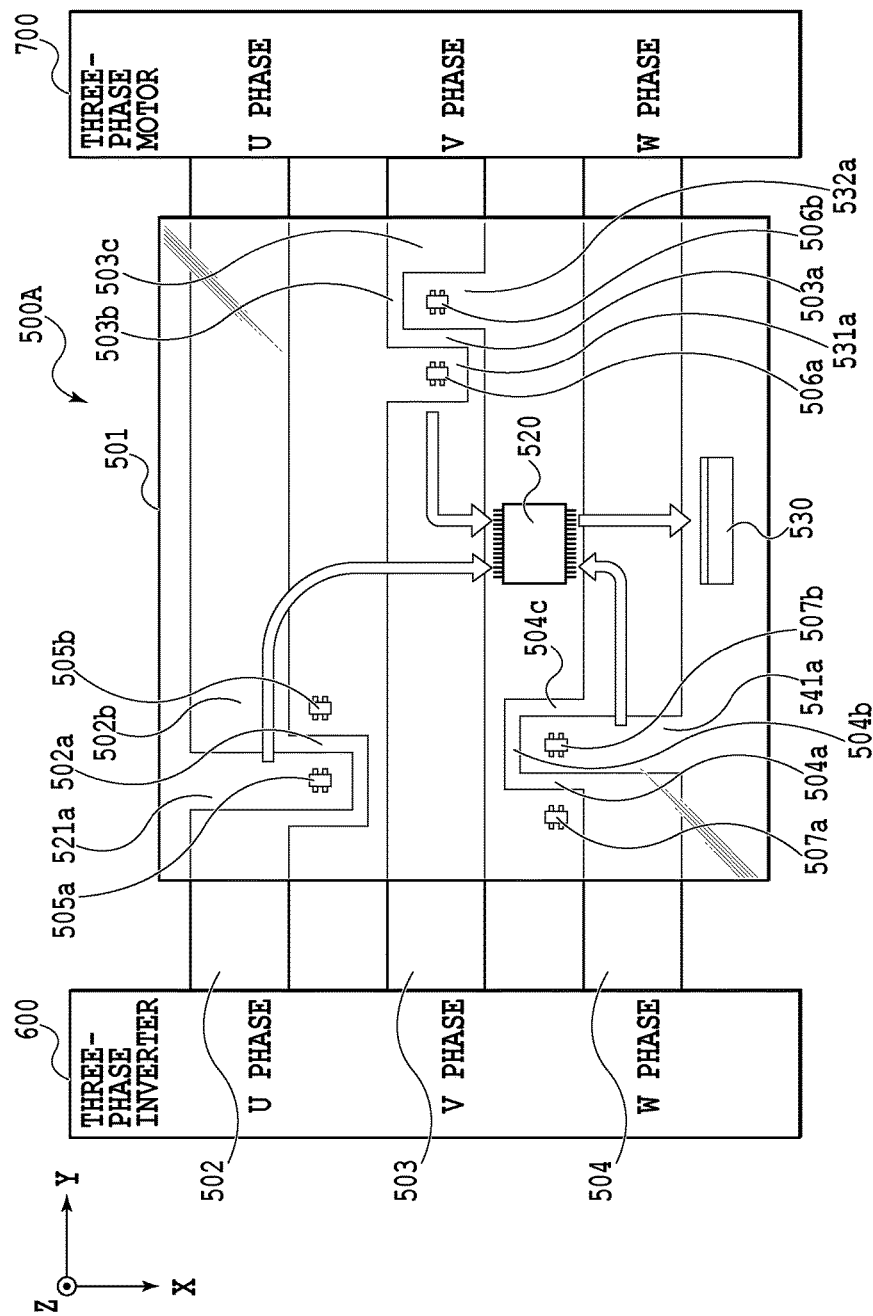
FIG. 15 is a diagram illustrating a configuration example of a current sensor according to a fifth embodiment.

FIG. 15 is a diagram illustrating a configuration example of a current sensor 500A that includes such busbars 502 to 504. Note that the configuration of the current sensor 500A is similar to that illustrated in FIGS. 14A and 14B. In the following description of the present embodiment, unless specifically noted otherwise, the same reference signs and the like used in the description of the fourth embodiment will be used as-is.

In the example of FIG. 15, the current in the busbar 502 changes direction following the cutout 521a (such as from the positive Y direction, to the positive X direction, to the positive Y direction, to the negative X direction, to the positive Y direction, for example), while the current in the busbar 503 changes direction following the cutouts 506a and 506b (such as from the positive Y direction, to the negative X direction, to the positive Y direction, for example), and the current in the busbar 504 changes direction following the cutout 541a (such as from the positive Y direction, to the negative X direction, to the positive Y direction, to the positive X direction, to the positive Y direction, for example).

Likewise, in the busbars 502 and 503, since the magnetic sensors 505a, 505b, 506a, 506b, 507a and 507b are arranged so that mutual interference of magnetic flux between channels is not produced, similarly to that of the fourth embodiment, the current sensor 500A is able to accurately detect current in three channels.

Sixth Embodiment

Figure 16:
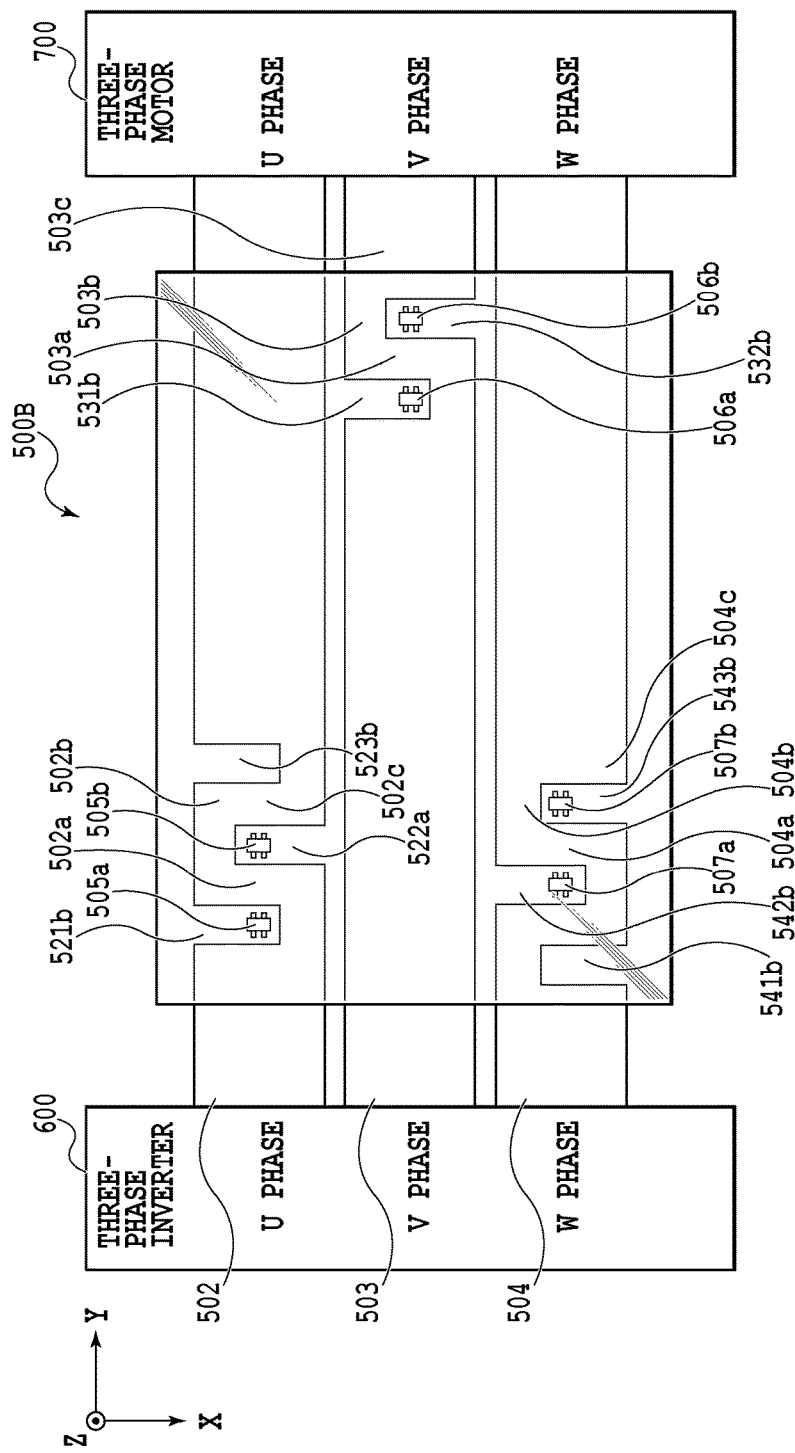
FIG. 16 is a diagram illustrating a configuration example of a current sensor according to a sixth embodiment.

In the current sensor 500B of the sixth embodiment, the shapes of the busbars 502, 503 and the 504 are modified as illustrated in FIG. 16.

FIG. 16 is a diagram illustrating a configuration example of a current sensor 500B that includes such busbars 502 to 504. Note that the configuration of the current sensor 500B differs from the illustration in FIGS. 14A and 14B in that the shapes of the busbars 502 to 504 are modified. In the following description of the present embodiment, unless specifically noted otherwise, the same reference signs and the like used in the description of the fourth embodiment will be used as-is.

In FIG. 16, although not illustrated, suppose that the current sensor 500B is also equipped with a signal processing IC and a connector.

In the example of FIG. 16, the current in the busbar 502 changes direction following the cutouts 521b, 522b, and 523b (such as from the positive Y direction, to the negative X direction, to the positive Y direction, to the positive X direction, to the positive Y direction, for example), while the current in the busbar 503 changes direction following the cutouts 531b and 532b (such as from the positive Y direction, to the negative X direction, to the positive Y direction, to the positive X direction, for example), and the current in the busbar 504 changes direction following the cutouts 541b, 542b, and 543b (such as from the positive Y direction, to the positive X direction, to the positive Y direction, to the negative X direction, to the positive Y direction, for example).

Likewise, in the busbars 502 and 503, since the magnetic sensors 505a, 505b, 506a, 506b, 507a, and 507b are arranged so that mutual interference of magnetic flux between channels is not produced, similarly to that of the fourth embodiment, the current sensor 500B is able to accurately detect current in three channels.

Seventh Embodiment

Figure 17:
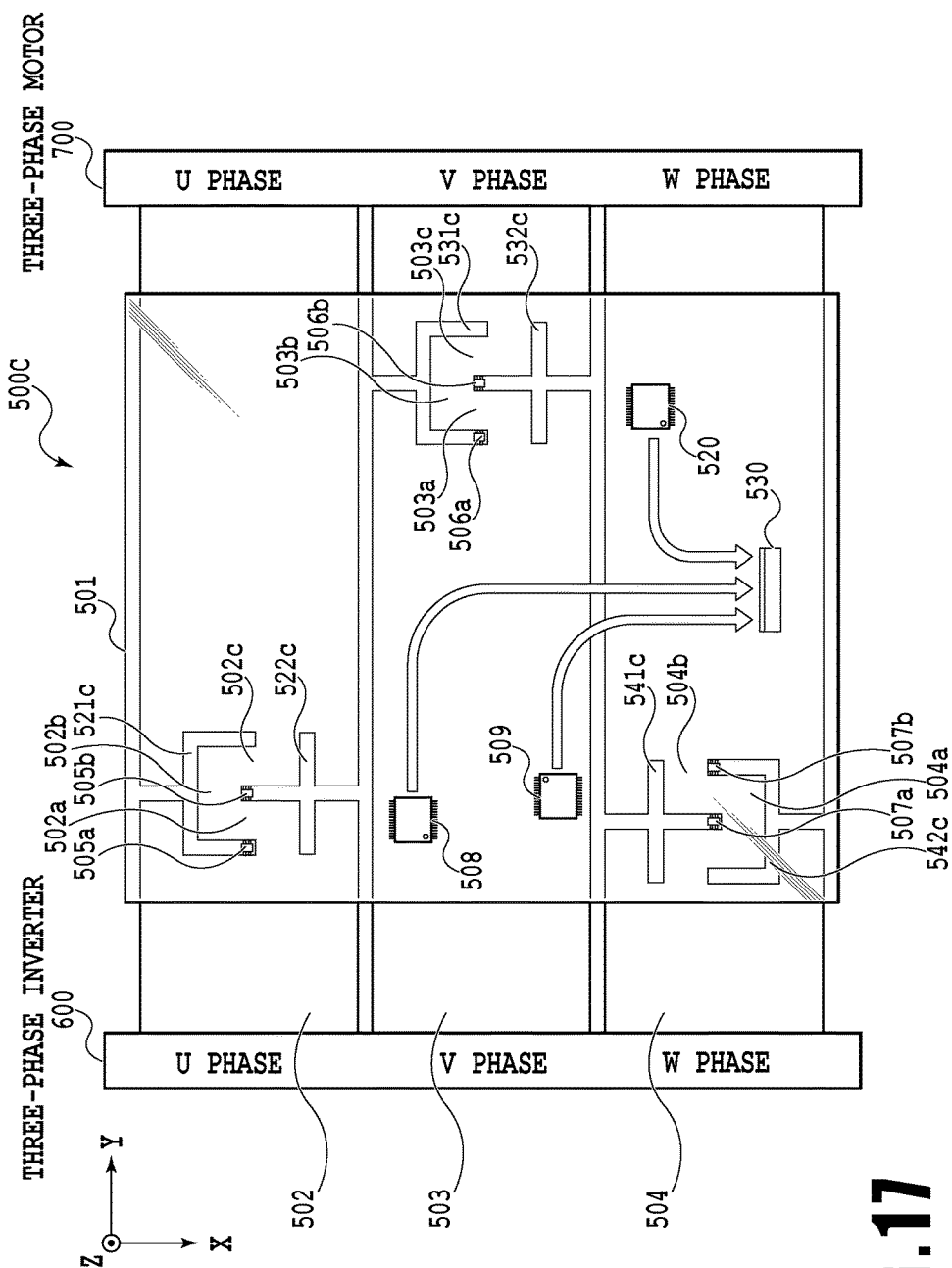
FIG. 17 is a diagram illustrating a configuration example of a current sensor according to a seventh embodiment.

In the current sensor 500C of the seventh embodiment, the shapes of the busbars 502, 503 and the 504 are modified as illustrated in FIG. 17. Furthermore, in the current sensor 500C, three signal processing ICs 508, 509 and 520 are provided.

FIG. 17 is a diagram illustrating a configuration example of a current sensor 500C that includes such busbars 502 to 504 and signal processing ICs 508, 509 and 520. Note that the configuration of the current sensor 500C is similar to the illustration in FIGS. 14A and 14B. In the following description of the present embodiment, unless specifically noted otherwise, the same reference signs and the like used in the description of the fourth embodiment will be used as-is.

In the example of FIG. 17, the current in the busbar 502 changes direction following the cutouts 521c and 522c (such as from the positive Y direction, to the negative X direction, to the positive Y direction, to the positive X direction, to the positive Y direction, for example), while the current in the busbar 503 changes direction following the cutouts 531c and 532c (such as from the positive Y direction, to the negative X direction, to the positive Y direction, to the positive X direction, to the positive Y direction, for example), and the current in the busbar 504 changes direction following the cutouts 541c, and 542c (such as from the positive Y direction, to the positive X direction, to the positive Y direction, to the negative X direction, to the positive Y direction, for example).

Likewise, in the busbars 502 and 503, since the magnetic sensors 505a, 505b, 506a, 506b, 507a and 507b are arranged so that mutual interference of magnetic flux between channels is not produced, similarly to that of the fourth embodiment, the current sensor 500C is able to accurately detect current in three channels.

In FIG. 17, the signal processing ICs 508, 509 and 520 are configured to detect current values for the U phase, V phase, and W phase, respectively. In other words, the signal processing IC 508 detects current values for the U phase on the basis of the difference in output between the magnetic sensors 505a and 505b, the signal processing IC 509 detects current values for the V phase on the basis of the difference in output between the magnetic sensors 506a and 506b, and the signal processing IC 520 detects current values for the W phase on the basis of the difference in output between the magnetic sensors 507a and 507b. Additionally, each of the signal processing ICs 508, 509 and 520 is electrically connected to the connector 530, and the output from the signal processing ICs 508, 509, and 520 is delivered to the connector 530. Even with such a configuration, advantageous effects similar to the fourth embodiment may be obtained.

Eighth Embodiment

The current sensor of the eighth embodiment is characterized by including a magnetic material arranged on the face opposite the mounting face of the magnetic sensors, so as to oppose and bridge the space between the two magnetic sensors.

Figure 18:
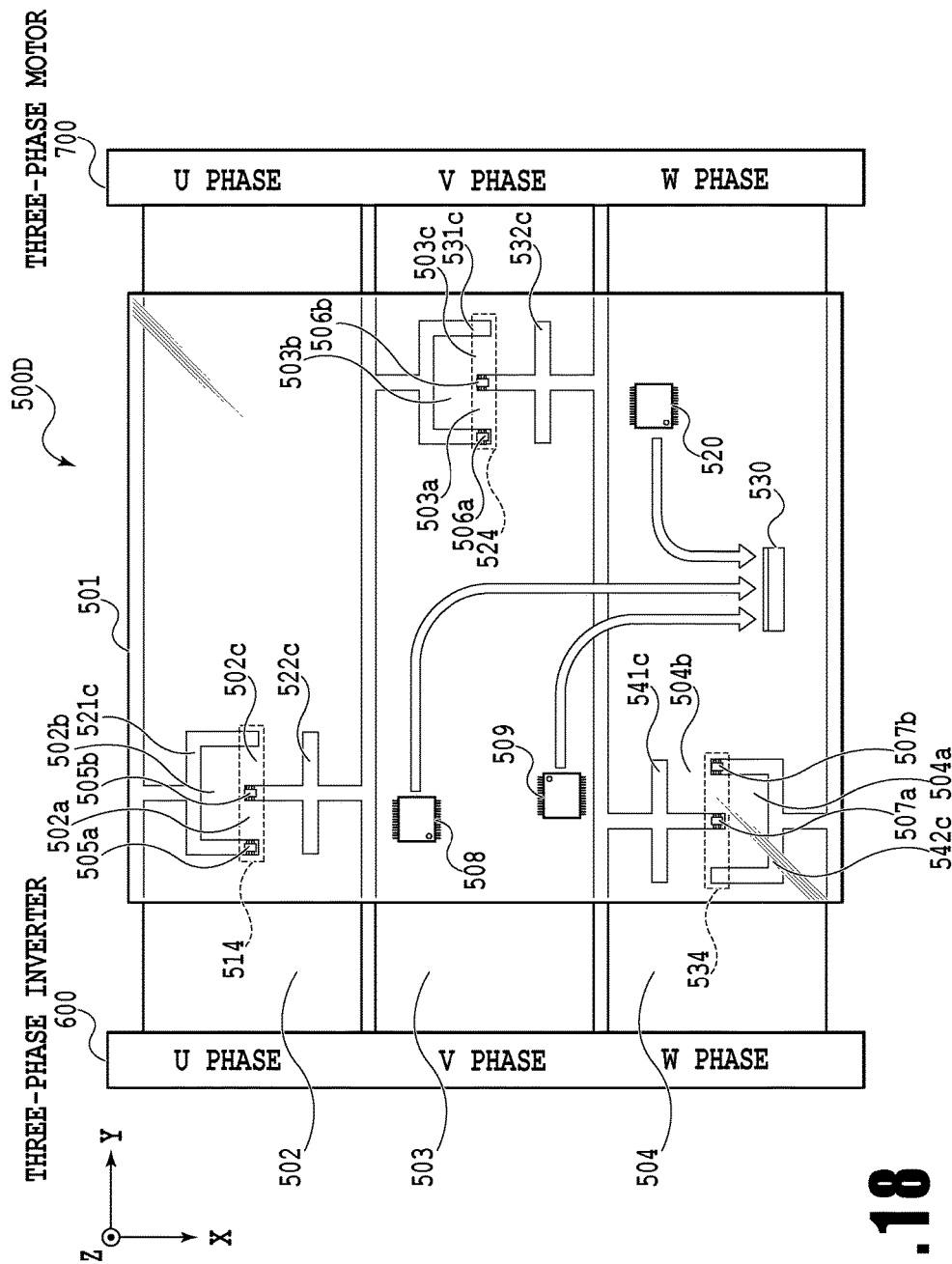
FIG. 18 is a diagram illustrating a configuration example of a current sensor according to an eighth embodiment.

FIG. 18 illustrates a configuration example of a current sensor 500D that includes such magnetic materials 514, 524, and 534. Note that the configuration of the current sensor 500D other than the magnetic materials 514, 524 and 534 is similar to the illustration in FIG. 17.

The magnetic materials 514, 524 and 534 illustrated in FIG. 18 correspond the magnetic materials in FIGS. 8 and 9, for example, and may be magnet plating or magnet chips such as ferrite, for example. Consequently, when current flows through the busbars 502 to 504, the magnetic flux produced by the current converges more readily on the magnetosensitive parts of the magnetic sensors 505a, 505b, 506a, 506b, 507a, and 507b. Also, magnetic noise of external origin received from the underside of the busbar board may be shut out. Consequently, the current detection sensitivity of the current sensor 500D is improved.

In FIG. 18, the magnetic materials 514, 524 and 534 are processed so as to extend through grooves in the busbar board formed by hole drilling or cutout processing and approach the magnetic sensors 505a, 505b, 506a, 506b, 507a and 507b from the underside of the printed circuit board, such as by being processed into an E-shape, for example. Consequently, the magnetic flux produced by current flowing through the busbars 502 to 504 may be converged onto the magnetic sensors 505a, 505b, 506a, 506b, 507a and 507b, and the current detection sensitivity of the current sensor 500D is improved.

[Modifications]

The current sensors 500 to 500C according to the respective embodiments discussed above are merely examples for the sake of illustration, and modifications as indicated below are also possible.

The sizes and shapes of the busbars (conductors) 502 to 504 in each embodiment may also be modified according to the specifications of the current sensor, insofar as the current direction may be changed. For example, shapes such as U-shapes may be used.

The shapes of the cutouts in each embodiment and the arrangement of the magnetic sensors may also be modified, insofar as current detection in three channels may be conducted accurately.

In the eighth embodiment, the magnetic materials 514, 524 and 534 are provided on the underside of the magnetic sensors, but in the busbar board of each embodiment, the magnetic materials 514, 524, and 534 may also be arranged on the package top face of the magnetic sensors 505a, 505b, 506a, 506b, 507a and 507b so as to bridge the space between the two magnetic sensors in each phase. Consequently, magnetic noise of external origin received from the top face of the package of the magnetic sensors 505a, 505b, 506a, 506b, 507a and 507b may be shut out.

Magnet plating or magnet chips may also be provided inside the magnetic sensors 505a, 505b, 506a, 506b, 507a and 507b of each embodiment. Even with such a configuration, the convergence of magnetic flux onto the magnetic sensors 505a, 505b, 506a, 506b, 507a and 507b is improved, and the current detection sensitivity of the current sensor is improved.

REFERENCE SIGNS LIST 1, 1A, 1B Current sensor
14a, 14b, 303, 305 Conductor
12a, 12b Measured current terminal
131a, 131b, 132a, 132b Magnetic sensor
20, 120, 302 Signal processing IC

The invention claimed is:

1. A current sensor comprising:
a first current pathway through which a first measured current flows;
a first magnetic sensor arranged near the first current pathway;
a second magnetic sensor arranged opposite the first magnetic sensor with the first current pathway in between;
a second current pathway through which a second measured current flows;
a third magnetic sensor arranged near the second current pathway;
a fourth magnetic sensor arranged opposite the third magnetic sensor with the second current pathway in between; and
a signal processor configured to generate a signal based on a quantity of the first measured current from output of the first magnetic sensor and output of the second magnetic sensor, and generate a signal based on a quantity of the second measured current from output of the third magnetic sensor and output of the fourth magnetic sensor, and
wherein the first magnetic sensor and the second magnetic sensor are arranged at an equal distance from the second current pathway, and the third magnetic sensor and the fourth magnetic sensor are arranged at an equal distance from the first current pathway;
the first current pathway includes a first pathway, a second pathway curving from the first pathway, and a third pathway additionally curving from the second pathway;
the second current pathway includes a fourth pathway, a fifth pathway curving from the fourth pathway, and a sixth pathway additionally curving from the fifth pathway; and
the second pathway is a pathway parallel to a line segment joining the third magnetic sensor and the fourth magnetic sensor, and the fifth pathway is a pathway parallel to a line segment joining the first magnetic sensor and the second magnetic sensor.

2. The current sensor according to claim 1, wherein:
the first magnetic sensor is arranged in an area enclosed by the first current pathway,
the second magnetic sensor is arranged opposite the first magnetic sensor with the first pathway in between,
the third magnetic sensor is arranged in an area enclosed by the second current pathway, and
the fourth magnetic sensor is arranged opposite the third magnetic sensor with the fourth pathway in between.

3. The current sensor according to claim 1, wherein:
the second pathway is a line-symmetric pathway taking, as an axis of symmetry, a perpendicular bisector of a line segment joining the third magnetic sensor and the fourth magnetic sensor, and
the fifth pathway is a line-symmetric pathway taking, as an axis of symmetry, a perpendicular bisector of a line segment joining the first magnetic sensor and the second magnetic sensor.

4. The current sensor according to claim 1, wherein:
the first pathway is a pathway connected to one end of the second pathway, and starting from the end of the second pathway, extending in a direction away from or in a direction approaching the third magnetic sensor and the fourth magnetic sensor,
the third pathway is a pathway connected to an other end of the second pathway, and starting from the end of the second pathway, extending in a direction away from or in a direction approaching the third magnetic sensor and the fourth magnetic sensor,
the fourth pathway is a pathway connected to one end of the fifth pathway, and starting from the end of the fifth pathway, extending in a direction away from or in a direction approaching the first magnetic sensor and the second magnetic sensor, and
the sixth pathway is a pathway connected to an other end of the fifth pathway, and starting from the end of the fifth pathway, extending in a direction away from or in a direction approaching the first magnetic sensor and the second magnetic sensor.

5. The current sensor according to claim 1, wherein an angle obtained between the first pathway and the second pathway, an angle obtained between the second pathway and the third pathway, an angle obtained between the fourth pathway and the fifth pathway, and an angle obtained between the fifth pathway and the sixth pathway are 90 degrees.

6. The current sensor according to claim 1, wherein the signal processor is configured to generate a signal based on a quantity of the first measured current from a difference between output of the first magnetic sensor and output of the second magnetic sensor, and generate a signal based on a quantity of the second measured current from a difference between output of the third magnetic sensor and output of the fourth magnetic sensor.

7. The current sensor according to claim 1, wherein the first current pathway and the second current pathway are U-shaped.

8. The current sensor according to claim 1, wherein the first current pathway and the second current pathway exist in an approximately point-symmetric positional relationship about a prescribed point between the second pathway and the fifth pathway.

9. The current sensor according to claim 8, wherein:
provided that the first pathway, the first magnetic sensor and the second magnetic sensor are designated as a first pattern, and the fourth pathway, the third magnetic sensor and the fourth magnetic sensor are designated as a second pattern,
the first pattern and the second pattern exist in an approximately point-symmetric positional relationship about a prescribed point between the second pathway and the fifth pathway facing opposite the second pathway.

10. The current sensor according to claim 1, wherein:
a perpendicular bisector of a line segment joining the first magnetic sensor and the second magnetic sensor passes through a center of the third magnetic sensor, and a perpendicular bisector of a line segment joining the third magnetic sensor and the fourth magnetic sensor passes through a center of the first magnetic sensor.

11. The current sensor according to claim 1, comprising:
a lead frame forming signal terminals;
an encapsulation member configured to encapsulate the first to second current pathways and the first to fourth magnetic sensors;
a first current terminal connected to the first current pathway and configured to act as an inlet of the first measured current;
a second current terminal connected to the first current pathway and configured to act as an outlet of the first measured current;
a third current terminal connected to the second current pathway and configured to act as an inlet of the second measured current; and
a fourth current terminal connected to the second current pathway and configured to act as an outlet of the second measured current, wherein:
the encapsulation member has a rectangular shape in a planar view, and
the lead frame forming the first to fourth current terminals and the signal terminals is exposed from a side face of the encapsulation member in a planar view.

12. The current sensor according to claim 11, wherein:
the first current terminal and the second current terminal are exposed from a side face, in a planar view, among the side faces of the encapsulation member, that is positioned at a right angle to the side face from which the lead frame forming the signal terminals is exposed, and
the third current terminal and the fourth current terminal are exposed from a side face, in a planar view, among the side faces of the encapsulation member, that opposes the side face from which the first current terminal and the second current terminal are exposed.

13. The current sensor according to claim 11, wherein the first to fourth current terminals are exposed from a side face, in a planar view, among the side faces of the encapsulation member, that opposes the side face from which the lead frame forming the signal terminals is exposed.

14. The current sensor according to claim 1, comprising:
a conductor arranged so as to enclose the second magnetic sensor and connected to either one of the first pathway and the second pathway, but not connected to the other; and
a conductor arranged so as to enclose the fourth magnetic sensor and connected to either one of the fourth pathway and the fifth pathway, but not connected to the other.

15. The current sensor according to claim 1, further comprising:
a third current pathway;
a fifth magnetic sensor arranged near the third current pathway; and
a sixth magnetic sensor arranged opposite the fifth magnetic sensor with the third current pathway in between, wherein:
the first current pathway, the second current pathway, and the third current pathway are current pathways formed inside conductors, the conductors allow current of respectively different phases to flow,
the third current pathway includes a seventh pathway, an eighth pathway curving from the seventh pathway, and a ninth pathway additionally curving from the eighth pathway, the fifth magnetic sensor is arranged in an area enclosed by the third current pathway,
the sixth magnetic sensor is arranged opposite the fifth magnetic sensor with the seventh pathway in between, and
a line segment joining the first magnetic sensor and the second magnetic sensor, a line segment joining the third magnetic sensor and the fourth magnetic sensor, and a line segment joining the fifth magnetic sensor and the sixth magnetic sensor are parallel to each other.

16. The current sensor according to claim 15, wherein each of the first to third current pathways is formed so that a current direction changes according to a cutout formed in the current pathway.

17. The current sensor according to claim 16, wherein each cutout in the adjacent current pathway is formed at a distance of at least double an interval between a pair of magnetic sensors away along a direction, in the direction the conductor of each phase extends.

18. The current sensor according to claim 17, wherein:
respective pairs of magnetic sensors for two phases are arranged shifted away from each other at a distance of ½ an interval between a pair of magnetic sensors along a direction in which the conductor of each phase extends, and
the pair of magnetic sensors for the remaining phase is arranged at a distance of at least double the interval between a pair of magnetic sensors away along the direction in which the conductor extends.

19. The current sensor according to claim 15, wherein each current pathway is formed inside a busbar acting as the conductor of each phase, the busbar of each phase and a printed circuit board are formed integrally as a busbar board.

20. The current sensor according to claim 19, wherein in the busbar board, both front and rear faces of the busbars are covered by the printed circuit board.

21. The current sensor according to claim 20, wherein in the busbar board, slits are provided in the busbars.

22. The current sensor according to claim 21, wherein in the busbar board, penetrating slits that penetrate the busbars and a board prepreg are provided, with inner walls of the penetrating slits being formed by the board prepreg so that the busbars are not exposed.

23. The current sensor according to claim 22, wherein in the penetrating slits of the busbar board, a magnetosensitive part of each of the magnetic sensors is sunken farther inward than a mounting face of the busbar board, and arranged near a center of thickness of the busbars.

24. The current sensor according to claim 19, wherein the busbar board is provided with a magnetic material arranged on a face opposite the mounting face of respective magnetic sensors, so as to oppose and bridge the gap between the respective magnetic sensors.

25. The current sensor according to claim 24, wherein in the busbar board, the magnetic material extends towards the magnetic sensors neighbourhood through grooves in the busbar board formed by hole drilling or cutout processing.

26. The current sensor according to claim 19, wherein the busbar board is provided with a magnetic material arranged on a top surface of a package of the magnetic sensors, so as to bridge the gap between the respective magnetic sensors for each phase.

27. The current sensor according to claim 19, wherein:
the busbars include a U-phase busbar, a V-phase busbar adjacent to the U-phase busbar and a W-phase busbar adjacent to the V-phase busbar, the first current pathway is formed inside the U-phase busbar, the second current pathway is formed inside the W-phase busbar, the third current pathway is formed inside the V-phase busbar, the cutout formed in the first current pathway is formed at a distance of one-half an interval between a pair of magnetic sensors away from the cutout formed in the second current pathway, along a direction in which the busbars extend, and the cutout formed in the third current pathway is formed at a distance of at least twice an interval between a pair of magnetic sensors away from the cutout formed in the first current pathway and the cutout formed in the second current pathway, along a direction in which the busbars extend.

28. The current sensor according to claim 19, wherein the current pathways are formed in a metal layer inside the printed circuit board.

29. The current sensor according to claim 19, wherein the signal processing IC and/or the magnetic sensors are mounted on the printed circuit board.

30. The current sensor according to claim 1, wherein the magnetic sensors are internally provided with magnet plating or magnet chips.

* * * * *